US010761654B2

(12) United States Patent
Takahashi et al.

(10) Patent No.: US 10,761,654 B2
(45) Date of Patent: Sep. 1, 2020

(54) CIRCUIT BOARD INSPECTION DEVICE AND CIRCUIT BOARD INSPECTION METHOD

(71) Applicant: NIDEC-READ CORPORATION, Kyoto (JP)

(72) Inventors: Tadashi Takahashi, Kyoto (JP); Toshihisa Hibarino, Kyoto (JP); Mutsuhiro Honda, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 610 days.

(21) Appl. No.: 15/522,790

(22) PCT Filed: Aug. 7, 2015

(86) PCT No.: PCT/JP2015/072558
§ 371 (c)(1),
(2) Date: Apr. 28, 2017

(87) PCT Pub. No.: WO2016/067709
PCT Pub. Date: May 6, 2016

(65) Prior Publication Data
US 2017/0315672 A1    Nov. 2, 2017

(30) Foreign Application Priority Data
Oct. 29, 2014    (JP) .................................. 2014-220189

(51) Int. Cl.
*G06F 3/041*    (2006.01)
*G06F 3/044*    (2006.01)
(Continued)

(52) U.S. Cl.
CPC ........... *G06F 3/0418* (2013.01); *G01R 27/26* (2013.01); *G01R 31/2812* (2013.01);
(Continued)

(58) Field of Classification Search
CPC ................ G01R 27/26; G01R 31/2839; G01R 31/2812; G01R 27/02; G01R 31/2829;
(Continued)

(56) References Cited

U.S. PATENT DOCUMENTS

2013/0093741 A1    4/2013    Akimoto et al.
2014/0375347 A1    12/2014    Wang

FOREIGN PATENT DOCUMENTS

CN    102998531 A    3/2013
CN    103364679 A    10/2013
(Continued)

OTHER PUBLICATIONS

Ishikawa, Hiroshi, Capacitance measuring circuit JPH0346572 A Translation (Year: 1991).*
Ikeda, Teruo., Inspection device of capacitive touch panel and method of inspection., JP4889833 (B2)A1 Translation (Year: 2012).*
International Search Report based on Application No. PCT/JP2015/072558 (2 Pages) dated Oct. 13, 2015.

*Primary Examiner* — Yoshihisa Ishizuka
(74) *Attorney, Agent, or Firm* — Viering, Jentschura & Partner MBB

(57) ABSTRACT

A measuring process unit for executing a measuring process of, in correspondence with a plurality of combinations obtained by respectively combining a plurality of connection terminals Tx and a plurality of connection terminals Ty, and in respect of the connection terminals Tx, Ty corresponding to each of the combinations, supplying an AC voltage SA to the connection terminals Ty by means of an AC current source 2 and detecting electric current flowing in the connection terminals Tx by means of an ammeter 3, to thereby acquire currents corresponding to each of the combinations; and a calculating unit for executing a calculating process of, based on the size of the currents detected by the ammeter 3 in the measuring process and on information indicating the currents' phases, calculating capacitance and resistance values corresponding to each of the combinations.

12 Claims, 13 Drawing Sheets

(51) Int. Cl.
*G01R 31/28* (2006.01)
*G01R 27/26* (2006.01)
*G06F 3/045* (2006.01)
*G01R 27/02* (2006.01)

(52) U.S. Cl.
CPC ......... *G01R 31/2839* (2013.01); *G06F 3/041* (2013.01); *G06F 3/044* (2013.01); *G06F 3/045* (2013.01); *G01R 27/02* (2013.01); *G01R 27/2605* (2013.01); *G01R 31/2829* (2013.01); *G06F 2203/04103* (2013.01)

(58) Field of Classification Search
CPC ..... G01R 27/2605; G06F 3/041; G06F 3/044; G06F 3/045; G06F 3/0418; G06F 2203/04103
See application file for complete search history.

(56) References Cited

FOREIGN PATENT DOCUMENTS

| | | | | |
|---|---|---|---|---|
| CN | 103487608 | A | 1/2014 | |
| JP | 60216493 | A | 10/1985 | |
| JP | 03046572 | A | 2/1991 | |
| JP | 05099788 | A | 4/1993 | |
| JP | 2005274225 | A | 10/2005 | |
| JP | 2010204021 | A | 9/2010 | |
| JP | 4889833 | B2 * | 3/2012 | ............. G06F 3/044 |
| JP | 2012122989 | A | 6/2012 | |
| JP | 2013088510 | A | 5/2013 | |
| JP | 2014238318 | A | 12/2014 | |
| WO | 2011121862 | A1 | 10/2011 | |

* cited by examiner

CIRCUIT BOARD INSPECTION DEVICE AND CIRCUIT BOARD INSPECTION METHOD

RELATED APPLICATIONS

The present application is a national stage entry according to 35 U.S.C. § 371 of PCT application No. PCT/JP2015/072558 filed on Aug. 7, 2015 which claims priority from Japanese application No. 2014-220189 filed on Oct. 29, 2014, and is incorporated herein by reference in its entirety.

TECHNICAL FIELD

The present invention relates to circuit board inspection devices and circuit board inspection methods for inspecting circuit boards.

BACKGROUND

Along with the rapid spread in popularity of electronic devices—foremost smartphones and tablet computers—in recent years, the demand for touchscreens that detect the location where a human finger or a stylus pen has touched the screen has been especially on the rise. A known touchscreen of this sort is the resistive-film type of touchscreen in which two resistive-film sheets are arranged in opposition and placed in a touch surface, wherein from the value of the resistance when a user has touched the touch surface, the touch position is detected. A known example of a method of inspecting this sort of resistive-film type of touchscreen is Patent Document 1.

Meanwhile, in recent years, touchscreens of the capacitive type—in which transparent electrodes arranged in the form of a grid are placed in the touch surface, and based on the capacitance produced when a user touches the screen with his or her finger(s), the touched position is detected—have come into widespread use. With the capacitive type of touchscreen, two-dimensional x-y coordinates are established in the face of the screen, and a plurality of transparent electrodes extending in the x direction and a plurality of transparent electrodes extending in the y direction, corresponding to the x-y coordinates, are arranged in opposition, electrically isolated from each other, on a transparent substrate such as, e.g., glass.

CITATION LIST

Patent Document

Patent Document 1: Japanese Unexamined Pat. App. Pub. No. 2005-274225

SUMMARY

Issues Invention is to Solve

In that regard, when a touchscreen of the capacitive type as described above is inspected, it is necessary to measure the capacitance produced between the transparent electrodes extending in the x direction and the transparent electrodes extending in the y direction, and the resistance of the transparent electrodes. For capacitance measurement, a device for measuring capacitance is employed, and for resistance measurement, a tester or similar device for measuring resistance is employed. Consequently, an operation for measuring capacitance and an operation for measuring resistance has been required, which has meant the inconvenience of an increased number of inspection steps.

An object of the present invention is to make available a circuit board inspection device and a circuit board inspection method whereby in the inspecting of circuit boards, such as e.g., touchscreens, in which a plurality of first electrodes extending along a predetermined first direction and a plurality of second electrodes extending along a second direction intersecting the first direction are formed opposing each other, reducing the number of steps in measuring capacitance and resistance values is facilitated.

Solution to Problem

A circuit board inspection device involving the present invention, being a circuit board inspection device for inspecting a circuit board in which a plurality of first electrodes extending along a predetermined first direction, and a plurality of second electrodes extending along a second direction intersecting the first direction are formed opposing each other, is furnished with: an AC voltage output unit for outputting a predetermined AC voltage; a current detecting unit for detecting electric current; a plurality of first connection terminals electrically connectable respectively with the plurality of first electrodes; a plurality of second connection terminals electrically connectable respectively with the plurality of second electrodes; a measuring process unit for executing a measuring process of, in correspondence with a plurality of combinations obtained by respectively combining the plurality of first connection terminals and the plurality of second connection terminals, and in respect of the first and second connection terminals corresponding to each of the combinations, supplying the AC voltage to the second connection terminals by means of the AC voltage output unit and detecting electric current flowing in the first connection terminals by means of the current detection unit, to thereby acquire currents corresponding to each of the combinations; and a calculating unit for executing a calculating process of, based on the magnitude of the currents detected by the current detecting unit in the measuring process and on information indicating the currents' phases, calculating capacitance and resistance values corresponding to each of the combinations.

Further, a circuit board inspection method involving the present invention, being a circuit board inspection method for inspecting a circuit board in which a plurality of first electrodes extending along a predetermined first direction, and a plurality of second electrodes extending along a second direction intersecting the first direction are formed opposing each other, includes: a step of electrically connecting a plurality of first connection terminals respectively with the plurality of first electrodes; a step of electrically connecting a plurality of second connection terminals respectively with the plurality of second electrodes; a measuring process step of executing a measuring process of, in correspondence with a plurality of combinations obtained by respectively combining the plurality of first connection terminals and the plurality of second connection terminals, and in respect of the first and second connection terminals corresponding to each of the combinations, supplying an AC voltage to the second connection terminals and detecting electric current flowing in the first connection terminals, to thereby acquire currents corresponding to each of the combinations; and a calculating step of executing a calculating process of, based on the magnitude of the currents detected in the measuring process and on information indicating the currents' phases, calculating capacitance and resistance values corresponding to each of the combinations.

According to these configurations, in inspecting a circuit board in which a plurality of first electrodes extending along a predetermined first direction, and a plurality of second electrodes extending along a second direction intersecting the first direction are formed opposing each other, in correspondence with a plurality of combinations obtained by respectively combining the plurality of first connection terminals and the plurality of second connection terminals, that is, each combination of the plurality of first electrodes and the plurality of second electrodes, by supplying an AC voltage to the second connection terminals and detecting electric current flowing in the first connection terminals, capacitance and resistance values corresponding to each of the combinations are calculated, based on the size of the detected current and information indicating the currents' phases. As a result, the operation for measuring capacitance and the operation for measuring resistance need not be executed separately. Accordingly, in inspecting a circuit board in which a plurality of first electrodes extending along a predetermined first direction, and a plurality of second electrodes extending along a second direction intersecting the first direction are formed opposing each other, reducing of the process steps for measuring capacitance and resistance values is facilitated.

Further, preferably the circuit board includes a plurality of first circuit board terminals each in electrical connection with the plurality of first electrodes, and a plurality of second circuit board terminals each in electrical connection with the plurality of second electrodes, wherein the plurality of first connection terminals are respectively connected with the plurality of first circuit board terminals, and are electrically connected respectively with the plurality of first electrodes via the plurality of first circuit board terminals, and the plurality of second connection terminals are respectively connected with the plurality of second circuit board terminals, and are electrically connected respectively with the plurality of second electrodes via the plurality of second circuit board terminals.

According to this configuration, since the first and second connection terminals are connected to the first and second circuit board terminals, without connecting of the first and second connection terminals directly to the first and second electrodes, making it possible to inspect the first and second electrodes via the first and second circuit board terminals, risk of damage to the first and second electrodes, such as their being scratched, arising is reduced while carrying out of circuit board inspection is facilitated.

Further, preferably the circuit board is a prearranged touchscreen in which an AC signal, at a predetermined reading frequency for reading capacitance at the positions where each of the first electrodes and each of the second electrodes intersect, is supplied to each of the first and second electrodes, wherein the frequency of the AC voltage is approximately equal to the reading frequency.

According to this configuration, since inspection of the touchscreen is carried out utilizing an AC voltage of frequency approximately equal to the reading frequency employed when the touchscreen is used, the touchscreen can be inspected under conditions near actual use conditions.

Also, preferably an internal parameters memory unit storing, as internal capacitance and internal resistance values, capacitance and resistance values arising within the circuit board inspection device interior in correspondence with each of the combinations is further provided, wherein the calculating unit further executes an internal parameters correction process of correcting the capacitance and resistance values corresponding to each of the combinations, based on the internal capacitance and internal resistance values stored in the internal parameters memory unit in correspondence with each of the combinations.

According to this configuration, through the capacitance and resistance values measured and calculated in correspondence with combinations of the first and second electrodes, influence on the capacitance and resistance values arising internally in the circuit board inspection device can be reduced, therefore making it possible to improve the accuracy with which the capacitance and resistance values for the inspection target locations are acquired.

In addition, preferably further provided is an internal parameters acquisition process unit for storing capacitance and resistance values, obtained in correspondence to each of the combinations by executing the measuring process and the calculating process by means of the measuring process unit and the calculating unit in a state in which the pluralities of first and second electrodes are not connected with the plurality of first and second connection terminals, in the internal parameters memory unit as the internal capacitance and internal resistance values corresponding to each of the combinations.

According to this configuration, capacitance and resistance values arising internally within the circuit board inspection device can be measured and calculated, and stored in the internal parameters memory unit as internal capacitance and internal resistance values.

Also, preferably a stray capacitance memory unit storing stray capacitances, produced in the circuit board, corresponding to each of the combinations is provided, wherein the calculating unit executes a stray capacitance correction process of correcting the capacitances corresponding to each of the combinations, based on the stray capacitances stored in the stray capacitance memory unit in correspondence with each of the combinations.

According to this configuration, since the influence of stray capacitances produced in the circuit board can be reduced through the capacitances measured and calculated in correspondence with the combinations of first and second electrodes, the accuracy with which capacitances at the inspection target locations are obtained can be improved.

In addition, preferably further provided are: a reference capacitance memory unit storing reference capacitances corresponding to each of the combinations, for a reference circuit board for which the reference capacitances, being capacitances produced circuit board-internally corresponding to each of the combinations, have been found in advance; and a stray capacitance acquisition process unit for, in a state in which with respect to the reference circuit board the pluralities of first and second connection terminals are connected, and based on capacitances obtained corresponding to each of the combinations by executing the measuring process and the calculating process by means of the measuring process unit and the calculating unit, and on the reference capacitances stored corresponding to each of the combinations by means of the reference capacitance memory unit, calculating, and storing in the stray capacitance memory unit, stray capacitances corresponding to each of the combinations.

According to this configuration, stray capacitances produced in circuit board in correspondence with each of the combinations can be measured, calculated and stored in the stray capacitance memory unit.

Also, preferably further provided is a display unit for displaying an image in which the resistance values, calculated by means of the calculating process, corresponding to each of the combinations are represented by a three-dimensional graph.

According to this configuration, since the combinations each correspond to combinations of the plurality of first electrodes and the plurality of second electrodes—that is, correspond to coordinate positions on the circuit board—representing the resistance values corresponding to each of the combinations with a three-dimensional graph enables a user to visually check the resistance values corresponding to the positions on the circuit board.

In addition, preferably further provided is a display unit for displaying an image in which the capacitance values, calculated by means of the calculating process, corresponding to each of the combinations are represented by a three-dimensional graph.

According to this configuration, since the combinations each correspond to combinations of the plurality of first electrodes and the plurality of second electrodes—that is, correspond to coordinate positions on the circuit board—representing the capacitance values corresponding to each of the combinations with a three-dimensional graph enables a user to visually check the capacitances corresponding to the positions on the circuit board.

Also, preferably further provided is a display unit for displaying an image in which the differences, calculated by means of the judgment unit, corresponding to each of the combinations are represented by a three-dimensional graph.

According to this configuration, since the combinations each correspond to combinations of the plurality of first electrodes and the plurality of second electrodes—that is, correspond to coordinate positions on the circuit board—representing with a three-dimensional graph the differences, corresponding to each of the combinations, between the calculated values for the resistance values and the judgment values enables a user to visually check discrepancies in the resistance values corresponding to the positions on the circuit board.

In addition, preferably further provided are: a judgment values memory unit storing in advance judgment values constituting references for judging quality of the resistance values corresponding to each of the combinations; and a judgment unit for calculating differences, respectively in correspondence with each of the combinations, between the resistance values corresponding to each of the combinations, obtained by means of the calculating unit, and the judgment values stored in the judgment values memory unit in correspondence with each of the combinations, and if the differences corresponding to each of the combinations exceed predetermined difference judgment values, judging coordinate positions represented by the first and second electrodes corresponding to the combinations in which the difference judgment values are exceeded to be defective positions on the circuit board.

According to this configuration, quality regarding each resistance value measured and calculated in correspondence with the combinations of first and second electrodes can be judged, and at the same time, defective positions therein can also be judged.

Advantageous Effects of Invention

A circuit board inspection device, and circuit board inspection method, of this sort of configuration, in inspecting a circuit board in which a plurality of first electrodes extending along a predetermined first direction, and a plurality of second electrodes extending along a second direction intersecting the first direction are formed opposing each other, reducing of the process steps for measuring capacitance and resistance values is facilitated.

DETAILED DESCRIPTION

Figure 1:
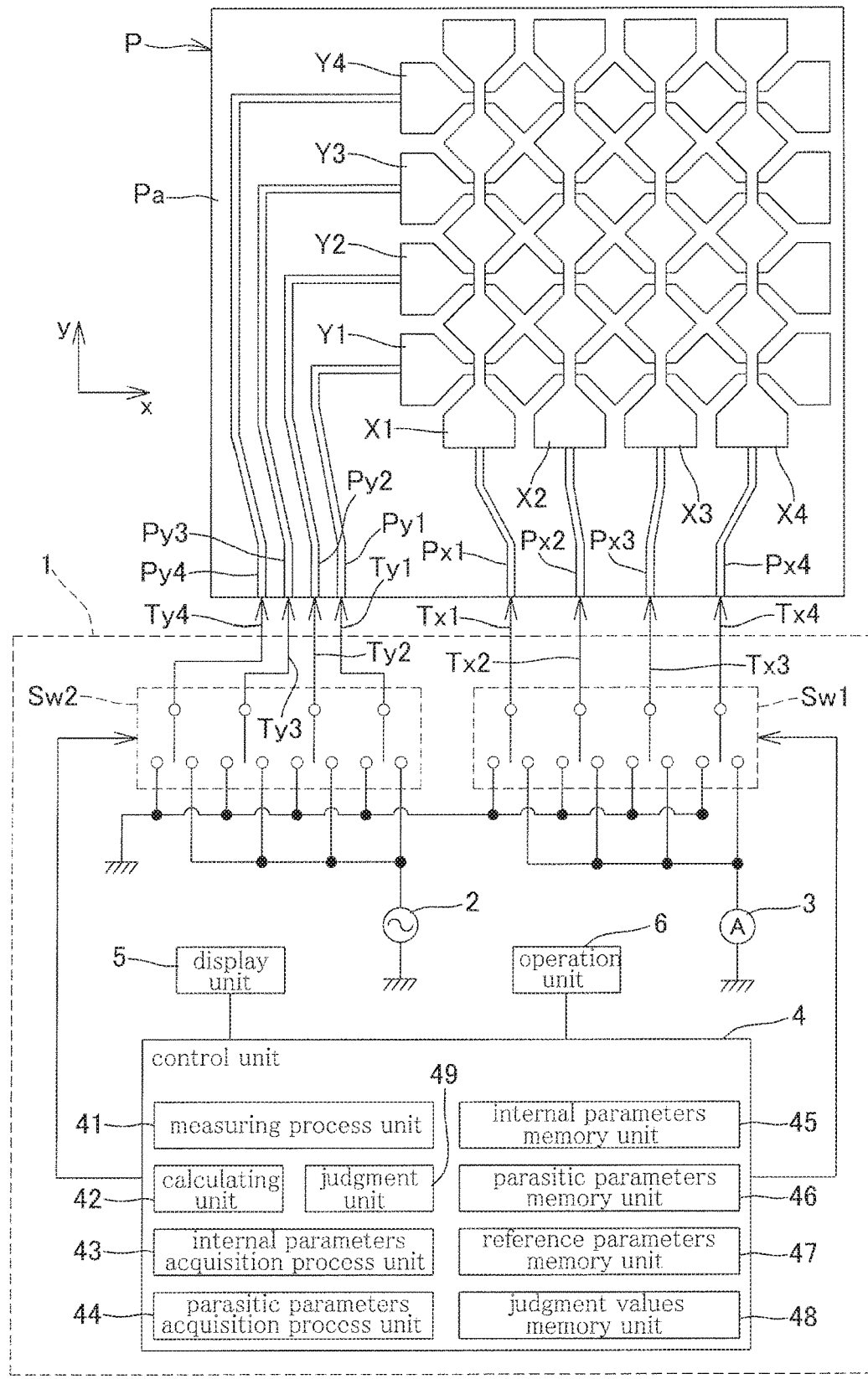
FIG. 1 is a block diagram schematically representing one example of the configuration of a circuit board inspection device involving one mode of embodying the present invention.

In the following, an explanation of modes embodying the present invention will be made with reference to the drawings. It should be understood that in each figure, configurations labeled with identical reference marks indicate that they are identical configurations, and that thus their description is omitted. FIG. 1 is a block diagram schematically representing one example of the configuration of a circuit board inspection device involving one mode of embodying the present invention. The circuit board inspection device 1 illustrated in FIG. 1 is furnished with: an AC power source 2 (AC voltage output unit); an ammeter 3 (current detection unit); a control unit 4; a display unit 5 (notification unit); an operation unit 6; connection terminals Tx1-Tx4 (first connection terminals); connection terminals Ty1-Ty4 (second connection terminals); and the selector switches SW1, SW2. It will be appreciated that the connection terminals Tx1-Tx4 may be the second connection terminals, and the connection terminals Ty1-Ty4 may be the first connection terminals.

The circuit board inspection device 1 illustrated in FIG. 1 is connected with a touchscreen circuit board P (circuit board) that is an inspection target. In the touchscreen circuit board P illustrated in FIG. 1, x-y coordinates are established, and in the example shown in FIG. 1, the horizontal axis is the x axis while the vertical axis is they axis.

In the touchscreen circuit board P, a plurality of X electrodes X1-X4 (first electrodes) spaced from each other and extending along the y-axis direction (first direction) and a plurality of Y electrodes Y1-Y4 spaced from each other and extending along the x-axis direction (second direction) perpendicular to the y-axis direction are formed on a plate-shaped transparent substrate Pa such as, e.g., glass, so as to oppose each other across the thickness of the touchscreen circuit board P (i.e., in a direction orthogonal to the plane of the drawing). Thus, the X electrodes X1-X4 correspond to x coordinates, and the Y electrodes correspond to y coordinates.

For example, the combination of the X electrode X1 and Y electrode Y1 corresponds to a coordinate position (X1, Y1), and the combination of the X electrode Xm and the Y electrode Yn corresponds to a coordinate position (Xm, Yn), where m and n are integers, on the touchscreen circuit board P.

It will be appreciated that the circuit board may not necessarily be a touchscreen circuit board, and examples include various types of substrates, such as printed circuit boards, flexible circuit boards, multilayer ceramic wiring boards, and electrode substrates for liquid crystal displays and plasma displays, as well as package substrates and film carriers for semiconductor packages.

Although an example containing four X electrodes and four Y electrodes is illustrated in FIG. 1 for convenience in illustration, the numbers of the electrodes may be determined as appropriate depending on the size of the touchscreen circuit board P and the accuracy of detecting positions.

The X electrodes X1-X4 and the Y electrodes Y1-Y4 are so-called transparent electrodes and are made of, for example, indium tin oxide (ITO), indium zinc oxidize (IZO), or the like. It should be noted that the X electrodes X1-X4 and the Y electrodes Y1-Y4 may be made of various materials, and they may not necessarily be transparent electrodes.

At the positions where the X electrodes X1-X4 intersect the Y electrodes Y1-Y4, an insulating film is formed between the crucible the X electrodes X1-X4 and the Y electrodes Y1-Y4 so that they are electrically insulated from each other. Because of the thickness of the insulating film, a very small gap is formed between the X electrodes X1-X4 and the Y electrodes Y1-Y4.

The shape of each of the X electrodes X1-X4 and the Y electrodes Y1-Y4 has such a pattern that a plurality of small rhombuses with a uniform size are skewered on a stick, in which wider portions and narrower portions repeatedly appear along a longitudinal direction. The X electrodes X1-X4 and the Y electrodes Y1-Y4 intersect at the narrower portions as viewed in plan. Thus, almost the entirety of the region capable of detecting a touch position (hereafter referred to as "touch region") is covered by any of the X electrodes X1-X4 and the Y electrodes Y1-Y4.

Formed on the touchscreen circuit board P are circuit board terminals Px1-Px4 (first circuit board terminals), which are electrically connected with the X electrodes X1-X4, and circuit board terminals Py1-Py4 (second circuit board terminals), which are electrically connected with the Y electrodes Y1-Y4. The circuit board terminals Px1-Px4 and the circuit board terminals Py1-Py4 are formed by screen printing using a conductive paste material, such as silver paste or copper paste.

It will be appreciated that the circuit board terminals Px1-Px4 and Py1-Py4 may be connectors, for example, or may be other connecting means. The circuit board terminals Px1-Px4 and Py1-Py4 may be ones that electrically connect the X electrodes X1-X4 and the Y electrodes Y1-Y4 with the connection terminals Tx1-Tx4 and Ty1-Ty4, and are not limited to the foregoing example. It is also possible to employ a configuration in which no circuit board terminals Px1-Px4 or Py1-Py4 are provided but the X electrodes X1-X4 and the Y electrodes Y1-Y4 are electrically connected directly with the connection terminals Tx1-Tx4 and Ty1-Ty4.

Figure 2:
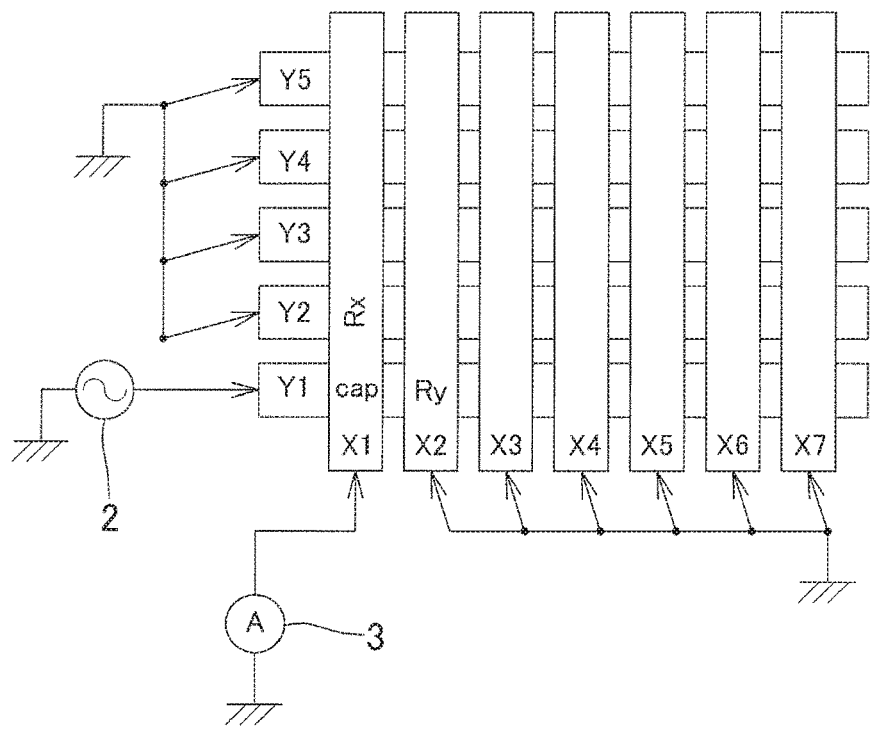
FIG. 2 is a schematic diagram abridging and schematically representing the circuit board inspection device illustrated in FIG. 1.

FIG. 2 is a schematic diagram abridging and schematically representing the circuit board inspection device 1 illustrated in FIG. 1. The circuit board inspection device 1 illustrated in FIG. 1 shows an example in which seven X electrodes X1-X7 and five Y electrodes Y1-Y5 are furnished. Although not shown in FIG. 2, the following description assumes that the circuit board inspection device 1 is furnished with: circuit board terminals Px1-Px7 (first circuit board terminals), connection terminals Tx1-Tx7 (first connection terminals), and a selector switch SW1, which correspond to the X electrodes X1-X7; and circuit board terminals Py1-Py5 (second circuit board terminals), connection terminals Ty1-Ty5 (second connection terminals), and a selector switch SW2, which correspond to the Y electrodes Y1-Y5 (second electrodes).

In the following, the configuration of the circuit board inspection device 1 will be described with reference to FIGS. 1 and 2 as appropriate. In the following, the X electrodes X1-X7 and the Y electrodes Y1-Y5 are collectively referred to as X electrodes X and Y electrodes Y, respectively, circuit board terminals Px1-Px7 and Py1-Py5 as circuit board terminals Px and Py, respectively, and connection terminals Tx1-Tx7 and Ty1-Ty5 as connection terminals Tx and Ty, respectively.

The touchscreen circuit board P is prearranged so that when the touchscreen circuit board P is assembled into a product and used, an AC signal, at a preestablished reading frequency f0 for reading capacitance at the positions where the X electrodes X and the Y electrodes Y intersect, is supplied to the Y electrodes Y via the connection terminals Ty and the circuit board terminals Py and supplied to the X electrodes X via the capacitance at the intersecting positions. The higher the reading frequency f0, the higher the position detecting speed of the touchscreen and the better the response of the touchscreen will be.

On the other hand, when the higher the reading frequency f0, the more easily noise will occur and the more difficult it will be to suppress noise. Accordingly, from the viewpoints of operability for user in operating the touchscreen and constraints in design, a frequency of from 100 kHz to 1 MHz, more preferably a frequency of from about 300 kHz to 500 kHz, for example, is used as a reading frequency f0 at which appropriate response of the touchscreen is obtained.

The connection terminals Tx1-Tx7 and Ty1-Ty5 are connection terminals configured to be connectable with the circuit board terminals Px1-Px7 and Py1-Py5. The connection terminals Tx1-Tx7 and Ty1-Ty5 are configured to be connected with the circuit board terminals Px1-Px7 and Py1-Py5 so that the connection terminals Tx1-Tx7 and Ty1-Ty5 are brought into electrical continuity with the X electrodes X1-Xx7 and the Y electrodes Y1-Y5, for example, when the user mounts the touchscreen circuit board P that is the inspection target to a predetermined mount position in the circuit board inspection device 1.

The selector switch SW1 switches the connecting destinations of each of the connection terminals Tx1-Tx7 between the ammeter 3 and circuit ground. The selector switch SW2 switches the connecting destinations of each of the connection terminals Ty1-Ty5 between the AC power source 2 and circuit ground.

The AC power source 2 supplies an AC signal at a root-mean-square value of output voltage V, for example, to the connection terminal Ty selected by the selector switch SW2. The AC signal SA is configured to be a sine wave or a rectangular wave. The frequency of the AC signal SA is set to a frequency substantially equal to the reading frequency f0, for example, within the frequency range of from f0×0.9 to f0×1.1. Setting the frequency f to a frequency substantially equal to the reading frequency f0 enables the inspection of the touchscreen circuit board P under almost the same conditions as in the use conditions of the touchscreen circuit board P, thus improving the reliability of the inspection.

The ammeter 3 detects the electric current flowing in the connection terminals Tx selected by the selector switch SW1 and outputs the information indicating the current value I and the phase difference $\theta$ to the control unit 4. The phase difference $\theta$ indicates the difference of phase of the detection current relative to the AC signal SA. It will be appreciated that although the phase difference $\theta$ is output as the information indicating the currents' phases in the foregoing example, the information indicating the currents' phases is not limited to the phase difference $\theta$. For example, it is possible that the ammeter 3 may output the phase of the detected current in real time. In that case, for example, the control unit 4 may be configured to calculate the phase difference $\theta$ between the AC signal SA and the detected current.

The display unit 5 is, for example, a display device, such as a liquid crystal display device or an organic electroluminescence (EL) display. The operation unit 6 is an operation input device for accepting user inputs. Examples of the operation unit 6 include operation switches, keyboards, and touchscreens.

The control unit 4 includes, for example: a CPU (Central Processing Unit) for executing predetermined arithmetic operations; a RAM (Random Access Memory) for temporarily storing data; a storage device such as a non-volatile ROM (Read Only Memory) or a HDD for storing a predetermined control program; memory units including an internal parameters memory unit 45, a parasitic parameters memory unit 46 (stray capacitance memory unit), a reference parameters memory unit 47 (reference capacitance memory unit), and a judgment values memory unit 48, each of which is composed of a storage device such as a HDD; and peripheral circuits thereof. By executing the control program stored in the storage, for example, the control unit 4 functions as a measuring process unit 41, a calculating unit 42, an internal parameters acquisition process unit 43, a parasitic parameters acquisition process unit 44 (stray capacitance acquisition process unit), and a judgment unit 49.

The measuring process unit 41 causes the AC current source 2 to supply an Ac signal SA to a connection terminal Tyn, in respect of connection terminals Txm and Tyn that correspond to a plurality of combinations obtained by respectively combining the connection terminals Tx1-Tx7 and the connection terminals Ty1-Ty5 and correspond to each of the combinations, and causes the ammeter 3 to detect electric current flowing in the connection terminal Txm. Thus, the measuring process unit 41 executes a measuring process of acquiring current values I and phase differences $\theta$ of the currents corresponding to the combinations.

When selecting the connection terminals Txm, the measuring process unit 41 causes the selector switch SW1 to connect the connection terminal Txm with the ammeter 3 and connect the connection terminals Tx other than the connection terminal Txm with circuit ground. When selecting the connection terminal Tyn, the measuring process unit 41 causes the selector switch SW2 to connect the connection terminal Tyn with the AC power source 2 and connect the connection terminals Ty other than the connection terminal Tyn with the circuit ground.

It will be appreciated that the measuring process unit 41 and the selector switches SW1 and SW2 may be configured to open the connection terminals other than the selected connection terminal.

Herein, since the connection terminals Tx1-Tx7 and the connection terminals Ty1-Ty5 are electrically connected respectively with the X electrodes X1-X7 and the Y electrodes Y1-Y5, a combination of the connection terminal Txn and the connection terminal Tym corresponds to a combination of the X electrode Xn and the Y electrode Ym. In other words, a combination of the connection terminal Txn and the connection terminal Tym corresponds to a coordinate position (Xm, Yn).

Specifically, in the measuring process, the measuring process unit 41 acquires current values I and phase differences $\theta$ corresponding to all the coordinate positions (X1, Y1)-(X7, Y5) on the touchscreen circuit board P. In the following, a current value I corresponding to a coordinate position (Xm, Yn) is referred to as a current value I (m, n), and a phase difference θ corresponding to the coordinate position (Xm, Yn) is referred to as a phase difference θ (m, n). Also, the process in which the measuring process unit 41 causes the selector switches SW1 and SW2 to select the connection terminals Txn and Tym and causes the ammeter 3 to measure a current value I (m, n) and a phase difference θ (m, n) is referred to simply as "measuring a current value I (m, n) and a phase difference θ (m, n)".

Based on the current value I and the phase difference θ, which are respectively the magnitude of the current and the information indicating the current's phase that have been detected by the ammeter 3 in the measuring process with the measuring process unit 41, the calculating unit 42 calculates capacitances C, and resistance values R of the X electrodes and the Y electrodes, corresponding to the respective combinations of the connection terminals, in other words, all the coordinate positions (X1, Y1)-(X7, Y5) on the touchscreen circuit board P. In the following, a capacitance C corresponding to a coordinate position (Xm, Yn) is referred to as a capacitance C (m, n), and a resistance value R corresponding to the coordinate position (Xm, Yn) is referred to as a resistance value R (m, n).

Figure 3:
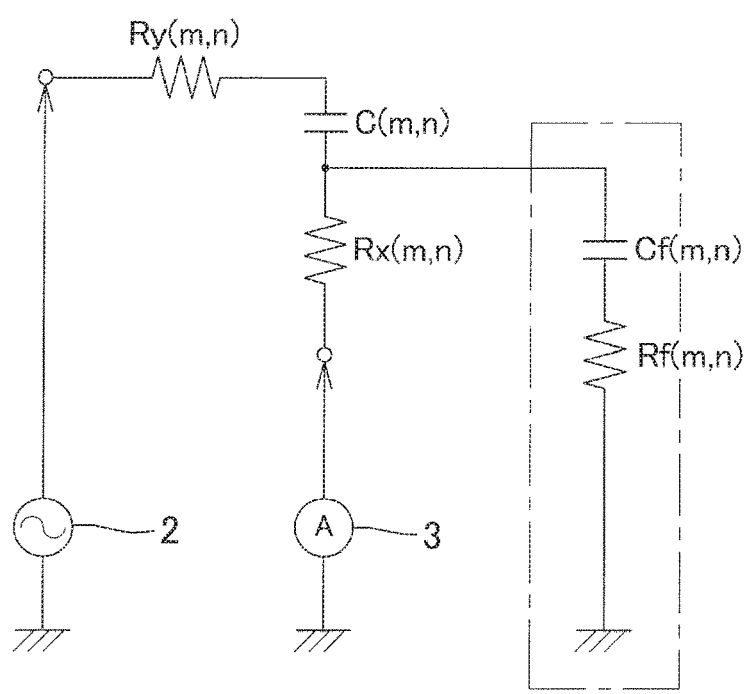
FIG. 3 is an equivalent circuit equivalently representing a measuring circuit when executing a measurement process in a case where connection terminals Txm, Tyn have been selected in a measuring process by the measuring process unit indicated in FIG. 1.

FIG. 3 is an equivalent circuit equivalently representing a measuring circuit when connection terminals Txm, Tyn have been selected in the measuring process by the measuring process unit 41 indicated in FIG. 1, that is, when executing a measurement process for the coordinate position (Xm, Yn). In the measurement circuit in this case, the resistance value of the section from the connection point of the connection terminal Tyn and the circuit board terminal Pyn to the intersection of the Y electrode Yn with the X electrode Xm is a resistance value Ry (m, n), the capacitance produced at the intersecting portion of the Y electrode Yn and the X electrode Xm is a capacitance C (m, n), and the resistance value of the section from the intersecting portion the Y electrode Yn and the X electrode Xm to the connection point of the circuit board terminal Pxm and the connection terminal Txm is a resistance value Rx (m, n).

When executing the measuring process for the coordinate position (Xm, Yn), the inspection target circuit is represented by a series circuit of a resistance value Ry (m, n), a capacitance C (m, n), and a resistance value Rx (m, n). In addition, although not shown in the drawings, an internal resistance value Ri (m, n), the resistance value within the circuit board inspection device 1, and an internal capacitance Ci (m, n) within the circuit board inspection device 1 are produced.

Also produced in the touchscreen circuit board P are a stray capacitance Cf (m, n) and a parasitic resistance value Rf (m, n), which is produced in association with the stray capacitance Cf (m, n). For convenience in illustration, FIG. 3 depicts that the stray capacitance Cf (m, n) and the parasitic resistance value Rf (m, n) are connected between the capacitance C (m, n) and the resistance value Rx (m, n); however, in reality, stray capacitances Cf (m, n) and parasitic resistance values Rf (m, n) are produced so as to be distributed over the entire inspection target circuit.

The calculating unit 42 calculates measured impedance Z (m, n) based on the current value I (m, n) and the phase difference θ (m, n) obtained in the measuring process of the measuring process unit 41, and the output voltage V of the AC power source 2.

$$Z(m,n)=V/I(m,n) \quad (1)$$

wherein m=1, 2, 3, 4, 5, 6, or 7; and n=1, 2, 3, 4, or 5.

Figure 4:
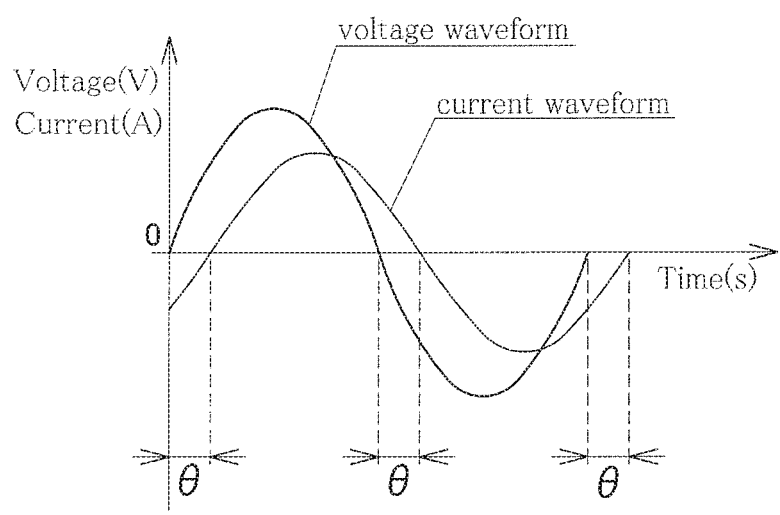
FIG. 4 is a waveform diagram illustrating the relationship between an AC-signal voltage waveform and a current waveform detected by an ammeter.
Figure 5:
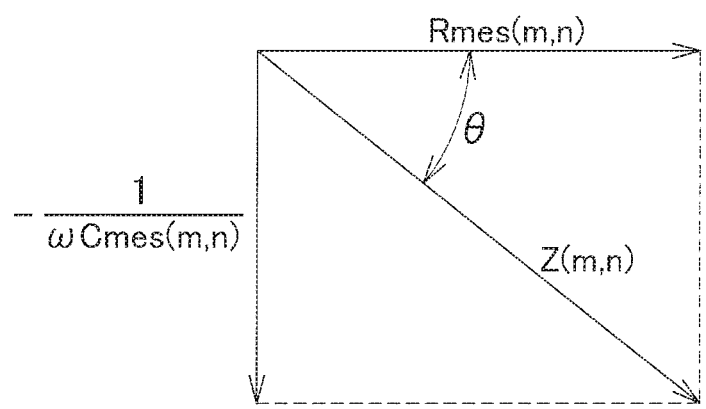
FIG. 5 is an explanatory diagram for explaining a method of calculating resistance values and capacitances from measured impedance and phase difference.

FIG. 4 is a waveform diagram illustrating the relationship between a voltage waveform of AC signal SA and a current waveform detected by the ammeter 3. FIG. 5 is an explanatory diagram for explaining a method of calculating resistance values R (m, n) and capacitances C (m, n) from measured impedance Z (m, n) and phase difference θ (m, n). The frequency of the AC signal SA is approximately equal to the reading frequency f0. The reading frequency f0 is a frequency such as to read the speed of a human finger movement on a touchscreen, so it is relatively a low frequency. Accordingly, the inductance component contained in the measured impedance Z (m, n) that occurs according to the frequency f of the AC signal SA is very small, and the measurement circuit can be approximated by an RC circuit, as illustrated in FIG. 3.

Accordingly, the measured impedance Z (m, n) can be decomposed into a resistance component and a capacitance component by a vector operation based on the phase difference θ (m, n). Specifically, the calculating unit 42 executes a calculating process of calculating measured resistance values Rmes (m, n) and capacitances Cmes (m, n) according to the following equations (2) and (3).

$$R\text{mes}(m,n)=Z(m,n)\times\cos\theta \quad (2)$$

$$C\text{mes}(m,n)=1/\{2\times\pi\times f\times Z(m,n)\times\sin\theta\} \quad (3)$$

wherein m=1, 2, 3, 4, 5, 6, or 7; and n=1, 2, 3, 4, or 5.

Herein, the measured resistance value Rmes (m, n) includes the foregoing internal resistance value Ri (m, n) and the foregoing parasitic resistance value Rf (m, n). The measured capacitance Cmes (m, n) includes the foregoing internal capacitance Ci (m, n) and the foregoing stray capacitance Cf (m, n). Accordingly, in order to acquire the resistance value R (m, n) and the capacitance C (m, n) accurately, it is necessary that the internal resistance value Ri (m, n), the parasitic resistance value Rf (m, n), the internal capacitance Ci (m, n), and the stray capacitance Cf (m, n) be excluded from the measured resistance value Rmes (m, n) and the measured capacitance Cmes (m, n). For that reason, the internal parameters acquisition process unit 43 and the parasitic parameters acquisition process unit 44 are provided.

The internal parameters acquisition process unit 43 causes the measuring process unit 41 and the calculating unit 42 to execute the measuring process and the calculating process described above, for example, in a state in which the touchscreen circuit board P has been removed from the circuit board inspection device 1 so that the X electrodes X and the Y electrodes Y are not electrically connected with the connection terminals Tx and Ty, i.e., in a state in which the connection terminals Tx and Ty are open. Thus, the internal parameters acquisition process unit 43 causes the internal parameters memory unit 45 to store the measured capacitances Cmes and the measured resistance values Rmes obtained corresponding to all the coordinate positions as the internal capacitances Ci (m, n) and the internal resistance values Ri (m, n) (wherein m=1, 2, 3, 4, 5, 6, or 7; and n=1, 2, 3, 4, or 5) corresponding to the coordinate positions (Xm, Yn) in correspondence with the combinations of the connection terminals Tx and Ty.

It will be appreciated that the internal parameters acquisition process unit 43 is not always necessary. For example, it is also possible that capacitances Ci (m, n) and internal resistance values Ri (m, n) (wherein m=1, 2, 3, 4, 5, 6, or 7; and n=1, 2, 3, 4, or 5) may be measured ahead of time experimentally and stored in the internal parameters memory unit 45 in advance.

Stored in the reference parameters memory unit 47 are reference capacitances Cref (m, n) and reference resistances Rref (m, n) (wherein m=1, 2, 3, 4, 5, 6, or 7 and n=1, 2, 3, 4, or 5), measured ahead of time experimentally for example, corresponding to every one of the coordinate positions (X1, Y1) through (X7, Y5), on a reference circuit board Pref for which reference capacitances Cref and reference resistances Rref capacitances and resistances produced internally in the touchscreen circuit board P, have been found in advance.

The parasitic parameters acquisition process unit 44 causes the measuring process unit 41 and the calculating unit 42 to execute the measuring process and the calculating process when, for example, a user operation instruction with the operation unit 6 for execution of the parasitic parameters acquisition process (stray capacitance acquisition process) is accepted in a state in which the user mounts the reference circuit board Pref to the circuit board inspection device 1 so that the circuit board terminals Px1-Px7 and Py1-Py5 are connected with the connection terminals Tx1-Tx7 and Ty1-Ty5, to thereby calculate the measured capacitances Cmes (m, n) and the measured resistance values Rmes (m, n) (wherein m=1, 2, 3, 4, 5, 6, 7; n=1, 2, 3, 4, 5) obtained corresponding to all the coordinate positions (X1, Y1)-(X7, Y5).

Then, based on the measured capacitances Cmes (m, n) and the measured resistance values Rmes (m, n) obtained in this way as well as the reference capacitances Cref (m, n) and reference resistance values Rref (m, n) (wherein m=1, 2, 3, 4, 5, 6, or 7; and n=1, 2, 3, 4, or 5), the parasitic parameters acquisition process unit 44 calculates the stray capacitances Cf (m, n) and the parasitic resistance values Rf (m, n) (wherein m=1, 2, 3, 4, 5, 6, or 7; and n=1, 2, 3, 4, or 5), and causes the parasitic parameters memory unit 46 to store the calculated results.

Specifically, the parasitic parameters acquisition process unit 44 calculates stray capacitances Cf and parasitic resistance values Rf (m, n) (wherein m=1, 2, 3, 4, 5, 6, or 7; and n=1, 2, 3, 4, or 5) according to the following equations (4) and (5).

$$\text{Stray capacitance } Cf(m,n)=Cmes(m,n)-Cref(m,n) \quad (4)$$

$$\text{Parasitic resistance value } Rf(m,n)=Rmes(m,n)-Rref(m,n) \quad (5)$$

wherein m=1, 2, 3, 4, 5, 6, or 7; and n=1, 2, 3, 4, or 5.

Based on the internal capacitances Ci (m, n) and the internal resistance values Ri (m, n) that are stored in the internal parameters memory unit 45 and the stray capacitances Cf (m, n) and the parasitic resistance values Rf (m, n) that are stored in the parasitic parameters memory unit 46, the calculating unit 42 corrects the measured capacitances Cmes (m, n) and the measured resistance values Rmes (m, n) of the touchscreen circuit board P that is the inspection target, and acquires the resistance values R (m, n) and the capacitances C (m, n) (wherein m=1, 2, 3, 4, 5, 6, or 7; and n=1, 2, 3, 4, or 5) of the touchscreen circuit board P that is the inspection target.

Specifically, the calculating unit 42 acquires the capacitances C (m, n) and the resistance values R (m, n) of the touchscreen circuit board P that is the inspection target, for example, according to the following equations (6) and (7).

$$\text{Capacitance } C(m,n)=Cmes(m,n)-Ci(m,n)-Cf(m,n) \quad (6)$$

$$\text{Resistance value } R(m,n)=Rmes(m,n)-Ri(m,n)-Rf(m,n) \quad (7)$$

wherein m=1, 2, 3, 4, 5, 6, or 7; and n=1, 2, 3, 4, or 5.

It will be appreciated that the calculating unit 42 may not use the stray capacitance Cf (m, n) and the parasitic resistance value Rf (m, n) for the correction, and may carry out correction according to the following equations (8) and (9).

$$\text{Capacitance } C(m,n)=Cmes(m,n)-Ci(m,n) \quad (8)$$

$$\text{Resistance value } R(m,n)=Rmes(m,n)-Ri(m,n) \quad (9)$$

wherein m=1, 2, 3, 4, 5, 6, or 7; and n=1, 2, 3, 4, or 5.

It is also possible that the calculating unit 42 may not use the internal capacitance Ci (m, n) and the internal resistance value Ri (m, n) for the correction, and may carry out correction according to the following equations (10) and (11).

$$\text{Capacitance } C(m,n)=Cmes(m,n)-Cf(m,n) \quad (10)$$

$$\text{Resistance value } R(m,n)=Rmes(m,n)-Rf(m,n) \quad (11)$$

wherein m=1, 2, 3, 4, 5, 6, or 7; and n=1, 2, 3, 4, or 5.

It is also possible that the calculating unit 42 may not carry out correction.

Stored in the judgment values memory unit 48 in advance are resistance judgment values Rj (m, n) and capacitance judgment values Cj (m, n), which are judgment values serving as the reference for judging quality of resistance values R (m, n) and capacitances C (m, n). The resistance judgment values Rj (m, n) and the capacitance judgment values Cj (m, n) may be actually measured values of a touchscreen circuit board P that is a conforming product or theoretical values, and for example, the resistance judgment values Rj (m, n) and the capacitance judgment values Cj (m, n) may be the reference resistances Rref (m, n) and the reference capacitances Cref (m, n) (wherein m=1, 2, 3, 4, 5, 6, or 7; and n=1, 2, 3, 4, or 5).

The judgment unit 49 calculates differences Dr (m, n) between the resistance values R (m, n) obtained by the calculating unit 42 and the resistance judgment values Rj (m, n) stored in the judgment values memory unit 48, respectively corresponding to all the coordinate positions (X1, Y1)-(X7, Y5). If a difference Dr (m, n) corresponding to a target coordinate position exceeds a preestablished difference judgment value Drj, the coordinate position (Xm, Yn) at which the difference judgment value Drj is exceeded is judged to be a defective resistance position on the touchscreen circuit board P, and the defective resistance position is displayed on the display unit 5.

Also, the judgment unit 49 calculates differences Dc (m, n) between the capacitances C (m, n) obtained by the calculating unit 42 and the capacitance judgment values Cj (m, n) stored in the judgment values memory unit 48, respectively corresponding to all the coordinate positions (X1, Y1)-(X7, Y5). If a difference Dc (m, n) corresponding to a target coordinate position exceeds a preestablished difference judgment value Dcj, the coordinate position (Xm, Yn) at which the difference judgment value Dcj is exceeded is judged to be a defective capacitance position on the touchscreen circuit board P, and the defective resistance position is displayed on the display unit 5.

Next, the operation of the circuit board inspection device 1 configured as described above will be described. FIGS. 6 to 9 are flowcharts representing a circuit board inspection method involving one mode of embodying the present invention. First, when, for example, the user operates the operation unit 6 to input an internal parameters acquisition instruction for ordering measurement of internal parameters of the circuit board inspection device 1 in a state in which, for example, the touchscreen circuit board P is not mounted to the circuit board inspection device 1 so that the connection terminals Tx1-Tx7 and Ty1-Ty5 are open, the internal parameters acquisition instruction is accepted by the operation unit 6 (YES at step S1), and the internal parameters acquisition process unit 43 executes an internal parameters acquisition process illustrated in FIG. 8 (step S2).

On the other hand, if the internal parameters acquisition instruction is not accepted by the operation unit 6 (NO at step S1), the internal parameters acquisition process unit 43 does not execute the internal parameters acquisition process and the process moves to step S3.

Figure 8:
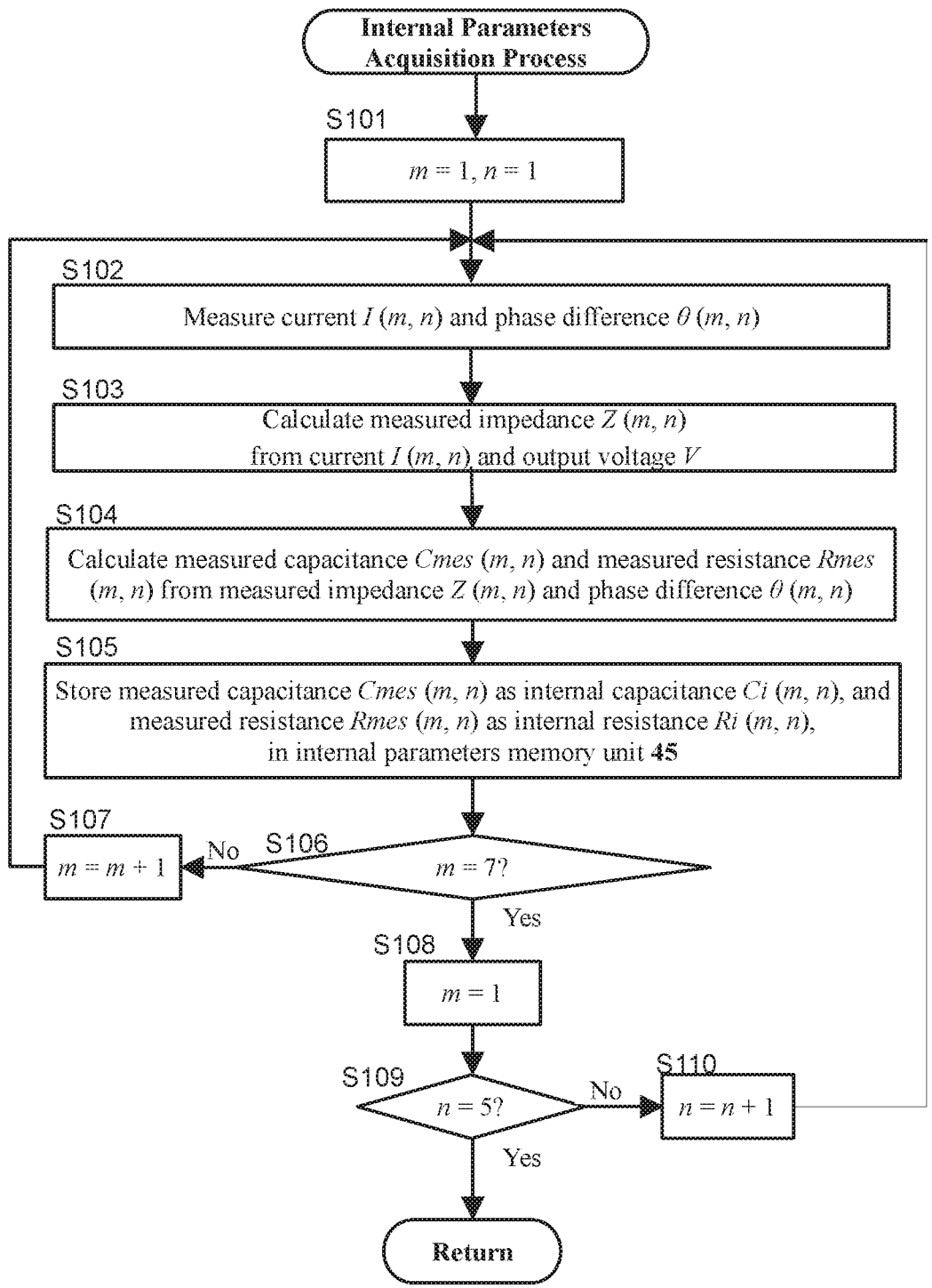
FIG. 8 is a flowchart representing circuit board inspection method involving one mode of embodying the present invention.

First, the internal parameters acquisition process illustrated in FIG. 8 will be described. In the internal parameters acquisition process, the internal parameters acquisition process unit 43 at first initializes parameters m and n to 1 (step S101). Next, the internal parameters acquisition process unit 43 causes the measuring process unit 41 to measure a current value I (m, n) and a phase difference θ (m, n) (step S102).

At step S102, the touchscreen circuit board P is not mounted to the circuit board inspection device 1. In this state, electric current flows within the circuit board inspection device 1 via capacitive coupling between the selector switch SW2 and the connection terminals Tyn, which are connected the AC power source 2, and the selector switch SW1 and the connection terminals Txm, which are connected to the ammeter 3. The electric current flowing in this way is measured at step S102, and the current value I (m, n) and the current's phase difference θ (m, n) is acquired.

Next, the internal parameters acquisition process unit 43 causes the calculating unit 42 to calculate a measured impedance Z (m, n) from the current value I (m, n) and an output voltage V according to, for example, equation (1) (step S103).

Next, the internal parameters acquisition process unit 43 allows calculating of a measured capacitance Cmes (m, n) and a measured resistance value Rmes (m, n) from the measured impedance Z (m, n) and the phase difference θ (m, n) according to, for example, equations (2) and (3) (step S104). The measured capacitance Cmes (m, n) and the measured resistance value Rmes (m, n) thus obtained reflect the parameters within the circuit board inspection device 1.

Then, the internal parameters acquisition process unit 43 causes the internal parameters memory unit 45 to store the measured capacitance Cmes (m, n) as an internal capacitance Ci (m, n) and the measured resistance values Rmes (m, n) as an internal resistance value Ri (m, n) (step S105).

If the parameter m is not 7 (NO at step S106), in other words, if there are remaining x coordinates that have not yet been processed for a coordinate Yn, the internal parameters acquisition process unit 43 adds a value 1 to the parameter m to acquire an internal capacitance Ci (m, n) and an internal resistance value Ri (m, n) that correspond to another remaining x coordinate (step S107), and repeats steps S102 to S106 again.

On the other hand, if the parameter m is 7 (YES at step S106), in other words, if all the x coordinates have been processed for the coordinate Yn, the internal parameters acquisition process unit 43 initializes the parameter m to 1 (step S108) and compares the parameter n with 5 (step S109).

If the parameter m is not 5 (NO at step S109), in other words, if there are remaining y coordinates that have not yet been processed, the internal parameters acquisition process unit 43 adds a value 1 to the parameter n to acquire an internal capacitance Ci (m, n) and an internal resistance value Ri (m, n) that correspond to another remaining y coordinate (step S110), and repeats steps S102 to S109 again.

Figure 6:
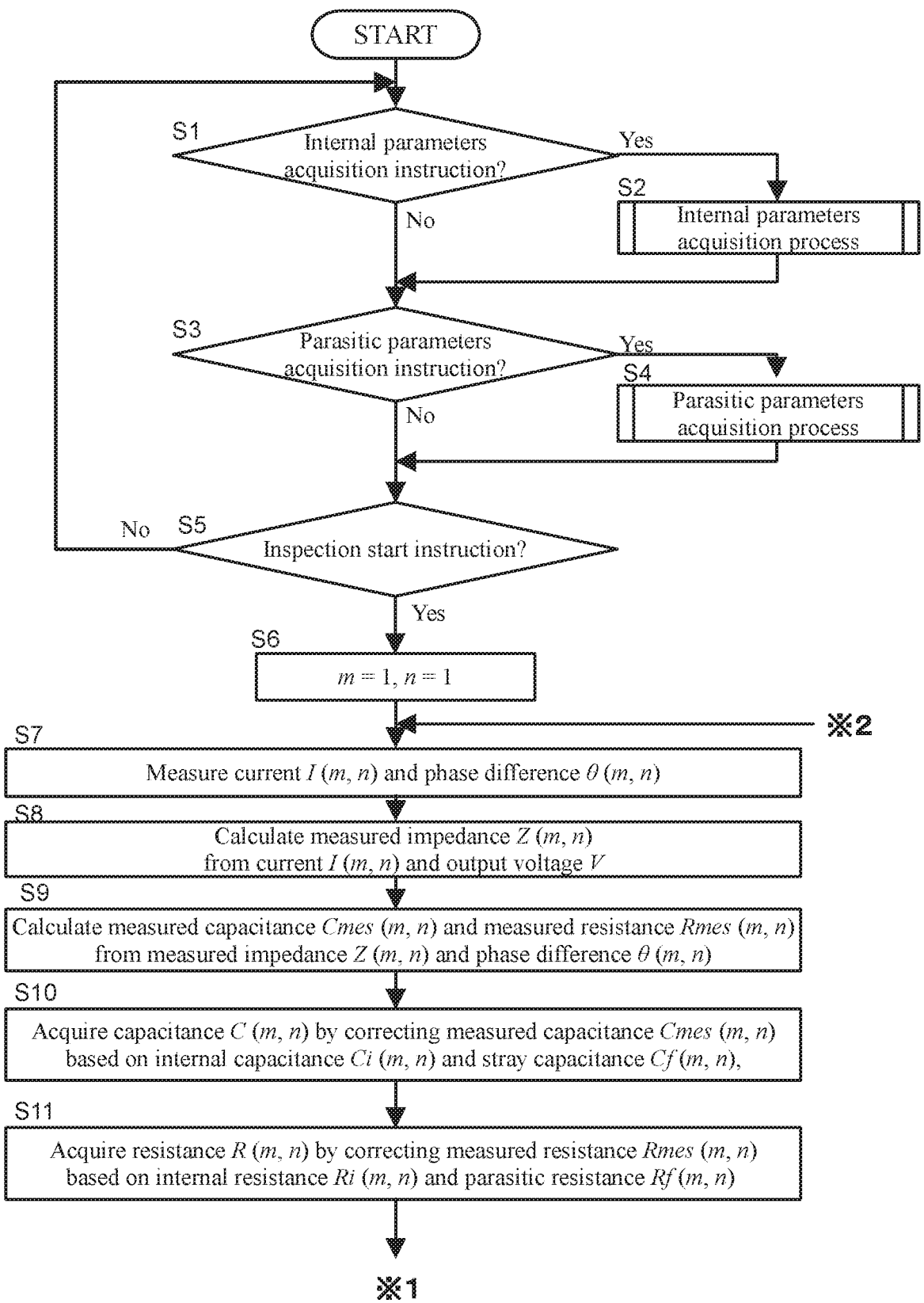
FIG. 6 is a flowchart representing circuit board inspection method involving one mode of embodying the present invention.
Figure 7:
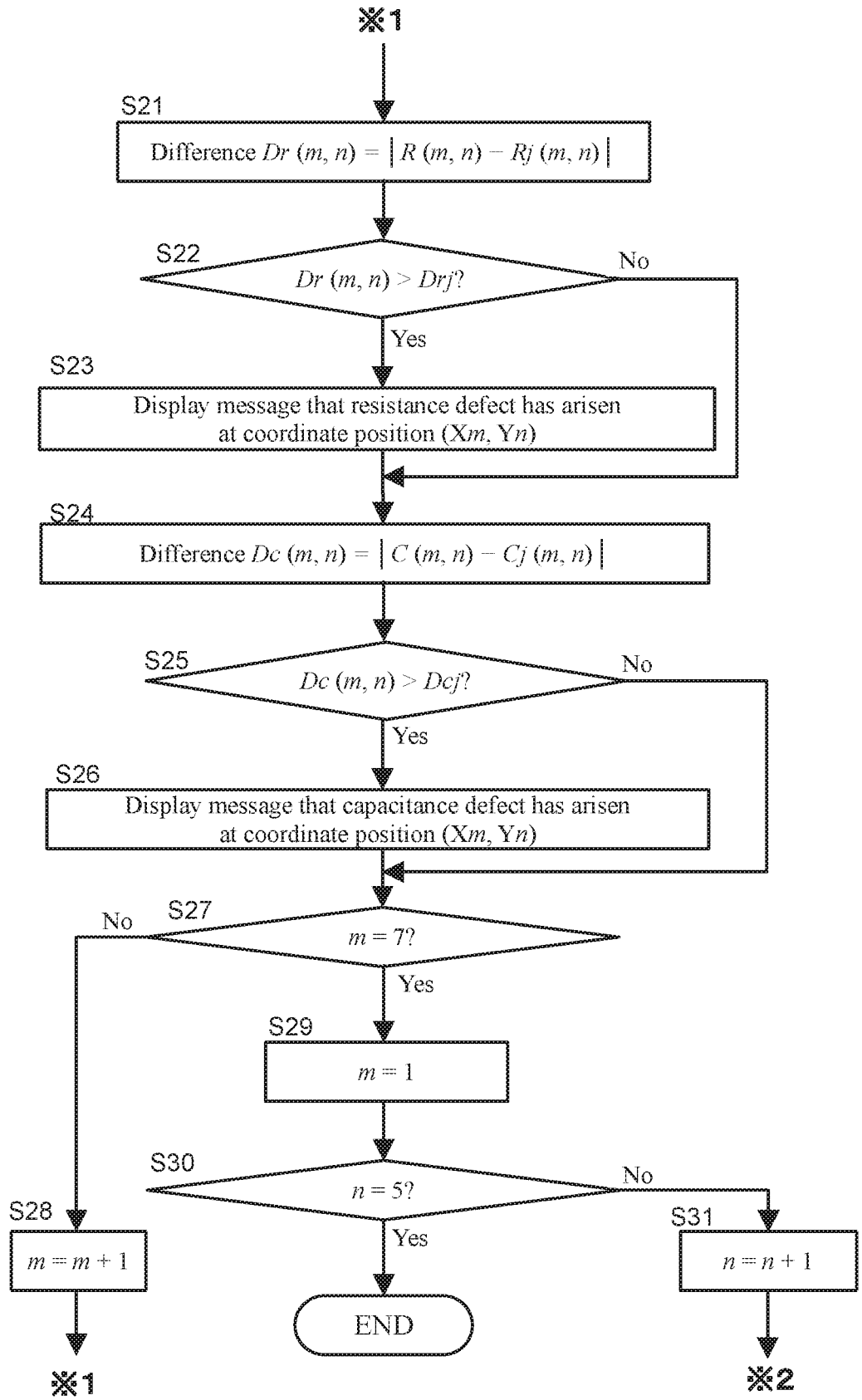
FIG. 7 is a flowchart representing circuit board inspection method involving one mode of embodying the present invention.

On the other hand, if the parameter n is 5 (YES at step S109), which means that the internal capacitances Ci (m, n) and the internal resistance values Ri (m, n) have been stored in the internal parameters memory unit 45 for all the combinations of the connection terminals Tx and the connection terminals Ty that correspond to all the coordinate positions (X1, Y1)-(X7, Y5) on the touchscreen circuit board P, then the internal parameters acquisition process unit 43 ends the internal parameters acquisition process, and the process moves to step S3 shown in FIG. 6.

When the parasitic parameters acquisition process is to be executed, the user mounts the reference circuit board Pref to the circuit board inspection device 1 so that the circuit board terminals Px1-Px7 and Py1-Py5 are connected with the connection terminals Tx1-Tx7 and Ty1-Ty5. If, for example, the user operates the operation unit 6 and inputs a parasitic parameters acquisition instruction for ordering measurement of parasitic parameters, the operation unit 6 accepts the parasitic parameters acquisition instruction (YES at step S3), and the parasitic parameters acquisition process unit 44 executes the parasitic parameters acquisition process illustrated in FIG. 9 (step S4). On the other hand, if the parasitic parameters acquisition instruction is not accepted by the operation unit 6 (NO at step S3), the parasitic parameters acquisition process unit 44 does not execute step S4 and the process moves to step S5.

Figure 9:
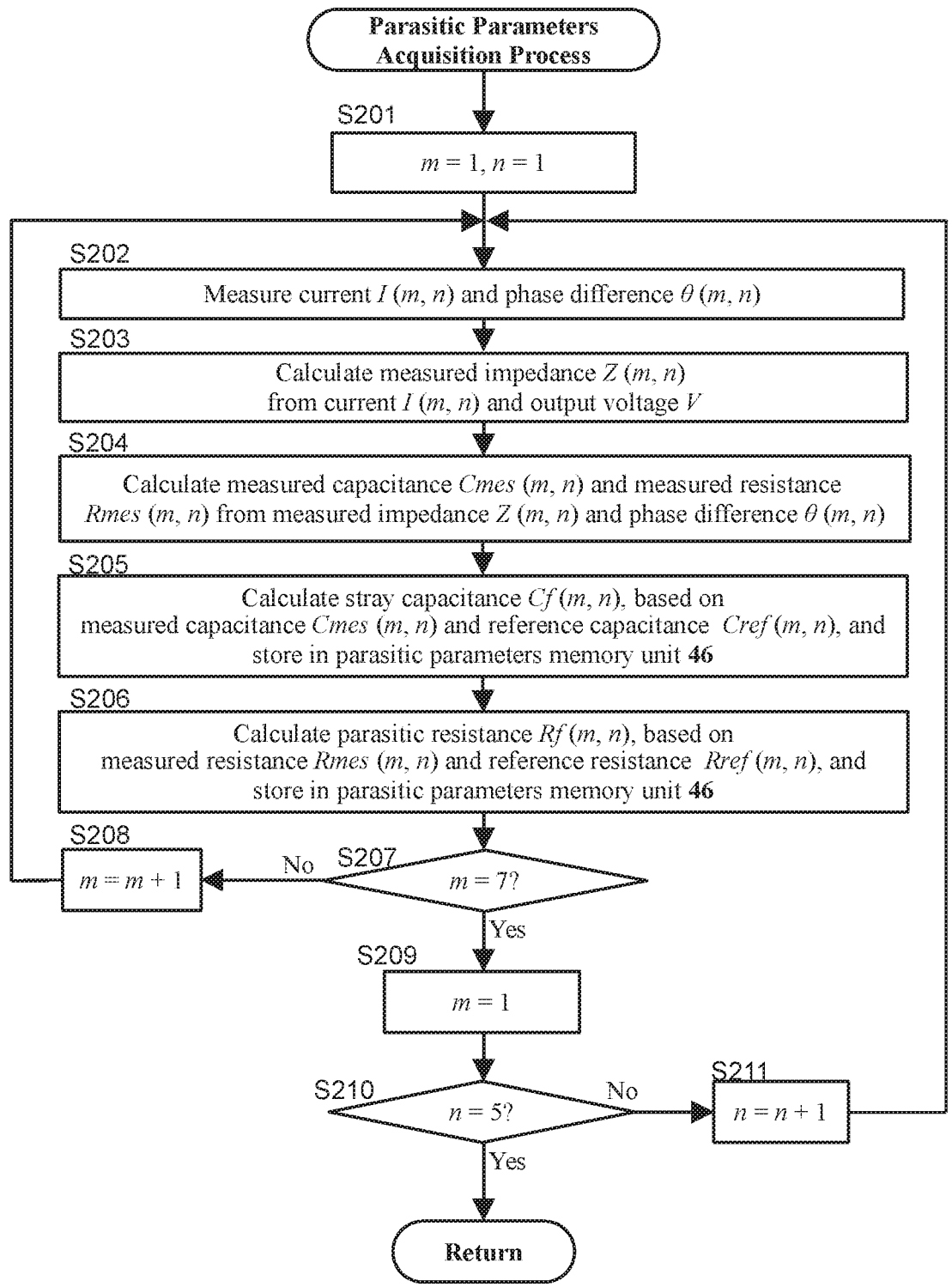
FIG. 9 is a flowchart representing circuit board inspection method involving one mode of embodying the present invention.

In the parasitic parameters acquisition process illustrated in FIG. 9, the parasitic parameters acquisition process unit 44 executes steps S201 to S204. Steps S201 to S204 are like steps S101 to S104 illustrated in FIG. 8 except that the parasitic parameters acquisition process unit 44 executes the processes in place of the internal parameters acquisition process unit 43, and therefore the description thereof is omitted.

At step S205, the parasitic parameters acquisition process unit 44 calculates a stray capacitance Cf (m, n) according to, for example, equation (4), based on the measured capacitance Cmes (m, n) obtained at step S204 and the reference capacitance Cref (m, n) stored in the reference parameters memory unit 47, and causes the parasitic parameters memory unit 46 to store the calculated result (step S205).

Next, the parasitic parameters acquisition process unit 44 calculates a parasitic resistance value Rf (m, n) according to, for example, equation (5), based on the measured resistance value Rmes (m, n) obtained at step S204 and the reference resistance value Rref (m, n) stored in the reference parameters memory unit 47, and causes the parasitic parameters memory unit 46 to store the calculated result (step S206).

If the parameter m is not 7 (NO at step S207), in other words, if there are remaining x coordinates that have not yet been processed for a coordinate Yn, the parasitic parameters acquisition process unit 44 adds a value 1 to the parameter m to acquire a stray capacitance Cf (m, n) and a parasitic resistance value Rf (m, n) that correspond to another remaining x coordinate (step S208), and repeats steps S202 to S207 again.

On the other hand, if the parameter m is 7 (YES at step S207), in other words, if all the x coordinates have been processed for the coordinate Yn, the parasitic parameters acquisition process unit 44 initializes the parameter m to 1 (step S209) and compares the parameter n with 5 (step S210).

If the parameter n is not 5 (NO at step S210), in other words, if there are remaining y coordinates that have not yet been processed, the parasitic parameters acquisition process unit 44 adds a value 1 to the parameter n to acquire a stray capacitance Cf (m, n) and a parasitic resistance value Rf (m, n) that correspond to another remaining y coordinate (step S211), and repeats steps S202 to S210 again.

On the other hand, if the parameter n is 5 (YES at step S210), which means that the stray capacitances Cf and the parasitic resistance values Rf have been stored in the internal parameters memory unit 46 for all the combinations of the connection terminals Tx and the connection terminals Ty that correspond to all the coordinate positions (X1, Y1)-(X7, Y5) on the touchscreen circuit board P, then the parasitic parameters acquisition process unit 44 ends the parasitic parameters acquisition process, and the process moves to step S5 shown in FIG. 6.

When carrying out an inspection of the touchscreen circuit board P, the user mounts the touchscreen circuit board P that is the inspection target to the circuit board inspection device 1 so that the circuit board terminals Px1-Px7 and Py1-Py5 are connected with the connection terminals Tx1-Tx7 and Ty1-Ty5. If, for example, the user operates the operation unit 6 and inputs an inspection start instruction for ordering the start of the inspection, the operation unit 6 accepts the inspection start instruction (YES at step S5), and the measuring process unit 41 initializes the parameters m and n in order to start the inspection of the touchscreen circuit board P (step S6).

Next, the measuring process unit 41 measures a current value I (m, n) and a phase difference θ (m, n) (step S7). Next, the calculating unit 42 calculates a measured impedance Z (m, n) from the current value I (m, n) and an output voltage V according to, for example, equation (1) (step S8).

Next, the calculating unit 42 calculates a measured capacitance Cmes (m, n) and a measured resistance value Rmes (m, n) from the measured impedance Z (m, n) and the phase difference θ (m, n) according to, for example, equations (2) and (3) (step S9). The measured capacitance Cmes (m, n) and the measured resistance value Rmes (m, n) obtained in this way include, in addition to the capacitance C (m, n) and the resistance value R (m, n) of the touchscreen circuit board P that is the inspection target, the internal capacitance Ci (m, n) and the internal resistance value Ri (m, n) as well as the stray capacitance Cf (m, n) and the parasitic resistance value Rf (m, n), respectively.

Accordingly, the calculating unit 42 corrects the measured capacitance Cmes (m, n) based on the internal capacitance Ci (m, n) stored in the internal parameters memory unit 45 and the stray capacitance Cf (m, n) stored in the parasitic parameters memory unit 46 according to, for example, equation (6), and acquires a capacitance C (m, n) (step S10: internal parameters correction process, stray capacitance correction process).

This reduces the influence of the internal capacitance Ci (m, n) and the stray capacitance Cf (m, n), improving the accuracy in measuring the capacitance C (m, n).

Next, the calculating unit 42 corrects the measured resistance value Rmes (m, n) based on the internal resistance value Ri (m, n) stored in the internal parameters memory unit 45 and the parasitic resistance value Rf (m, n) stored in the parasitic parameters memory unit 46 according to, for example, equation (7), and acquires a resistance value R (m, n) (step S11: stray capacitance correction process).

This reduces the influence of the internal resistance value Ri (m, n) and the parasitic resistance value Rf (m, n), improving the accuracy in measuring the resistance value R (m, n).

Next, the judgment unit 49 calculates a difference Dr (m, n) between the resistance value R (m, n) obtained by the calculating unit 42 and the resistance judgment value Rj (m, n) stored in the judgment values memory unit 48 (step S21).

Then, the judgment unit 49 compares the difference Dr (m, n) with a preestablished difference judgment value Drj (step S22), and if the difference Dr (m, n) exceeds the difference judgment value Drj (YES at step S22), the judgment unit 49 causes the display unit 5 to display a message indicating that there is a resistance defect at the coordinate position (Xm, Yn) (step S23). On the other hand, if the difference Dr (m, n) does not exceed the difference judgment value Drj, the judgment unit 49 does not execute step S23, and the process moves to step S24. The difference judgment value Drj is set to an appropriate value according to the performance required for the touchscreen circuit board P.

At step S24, the judgment unit 49 calculates a difference Dc (m, n) between the capacitance C (m, n) obtained by the calculating unit 42 and the capacitance judgment value Cj (m, n) stored in the judgment values memory unit 48 (step S24).

Then, the judgment unit 49 compares the difference Dc (m, n) with a preestablished difference judgment value Dcj (step S25), and if the difference Dc (m, n) exceeds the difference judgment value Dcj (YES at step S25), the judgment unit 49 causes the display unit 5 to display a message indicating that there is a capacitance defect at the coordinate position (Xm, Yn) (step S26). On the other hand, if the difference Dc (m, n) does not exceed the difference judgment value Dcj (NO at step S25), the judgment unit 49 does not execute step S26, and the process moves to step S27. The difference judgment value Dcj is set to an appropriate value according to the performance required for the touchscreen circuit board P.

At step S27, if the parameter m is not 7 (NO at step S27), in other words, if there are remaining x coordinates that have not yet been processed for a coordinate Yn, the measuring process unit 41 adds a value 1 to the parameter m to execute an inspection for another remaining x coordinate (step S28), and repeats steps S7 to S27 again.

On the other hand, if the parameter m is 7 (YES at step S27), in other words, if all the x coordinates have been processed for the coordinate Yn, the measuring process unit 41 initializes the parameter m to 1 (step S29) and compares the parameter n with 5 (step S30).

If the parameter n is not 5 (NO at step S30), in other words, if there are remaining y coordinates that have not yet been processed, the measuring process unit 41 adds a value 1 to the parameter n to execute an inspection for another remaining y coordinate (step S31), and repeats steps S7 to S30 again.

On the other hand, if the parameter n is 5 (YES at step S30), which means that the inspection has been completed for all the combinations of the connection terminals Tx and the connection terminals Ty that correspond to all the coordinate positions (X1, Y1)-(X7, Y5) on the touchscreen circuit board P, the process ends.

Thus, with the measuring process (measuring step) of steps S7, S102, and S202 and the calculating process (calculating step) of step S8, S9, S103, S104, S203, and S204, the capacitance and the resistance value corresponding to each of the coordinate positions can be obtained by merely measuring the current value I and the phase difference θ one time for each of the coordinate positions. Therefore, it is easier to reduce the number of steps in measuring capacitance and resistance values than executing the measuring step for capacitance and the measuring step for resistance values separately.

Moreover, the processes of steps S10 and S11 make it possible to reduce the influence of the internal capacitance Ci, the internal resistance value Ri, the stray capacitance Cf and the parasitic resistance value Rf, and thus improve the accuracy in measuring the capacitances C and the resistance values R. As a result, the accuracy in inspecting touchscreen circuit boards P can be improved.

Figure 10:
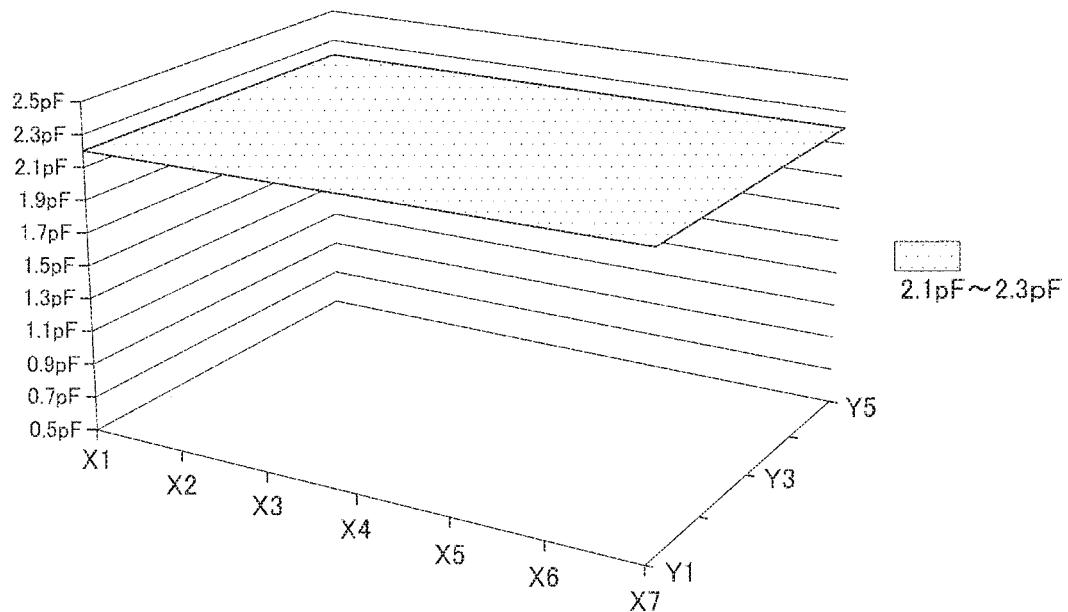
FIG. 10 is an explanatory diagram for explaining one example of the relationship between measured capacitances corresponding to each of coordinate positions on a touchscreen circuit board, and frequency of an AC signal utilized in the measurement.
Figure 11:
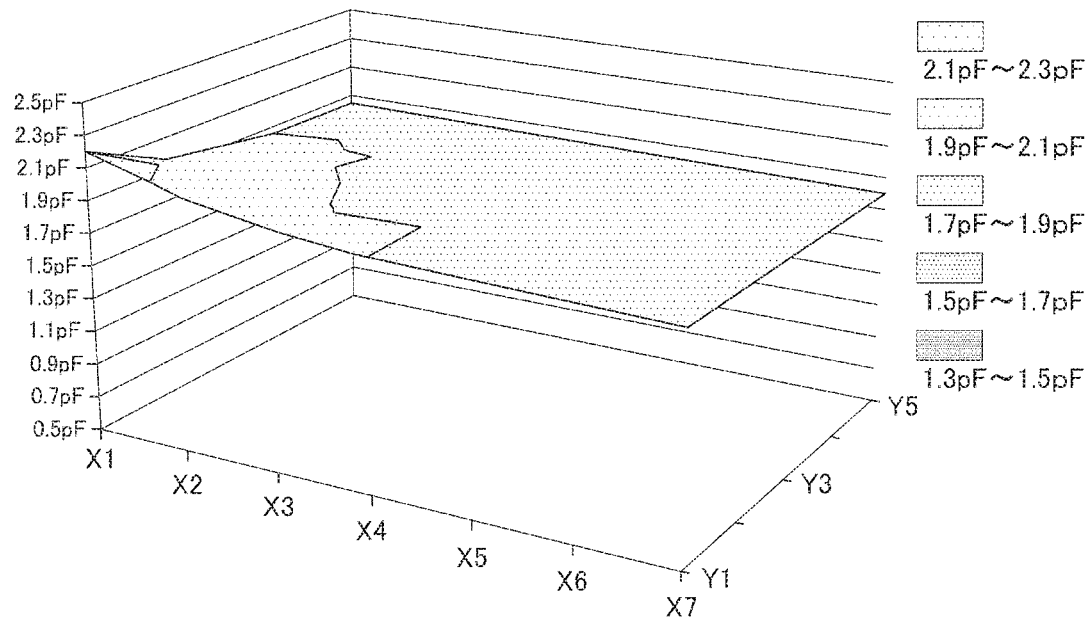
FIG. 11 is an explanatory diagram for explaining one example of the relationship between measured capacitances corresponding to each of coordinate positions on a touchscreen circuit board, and frequency of an AC signal utilized in the measurement.
Figure 12:
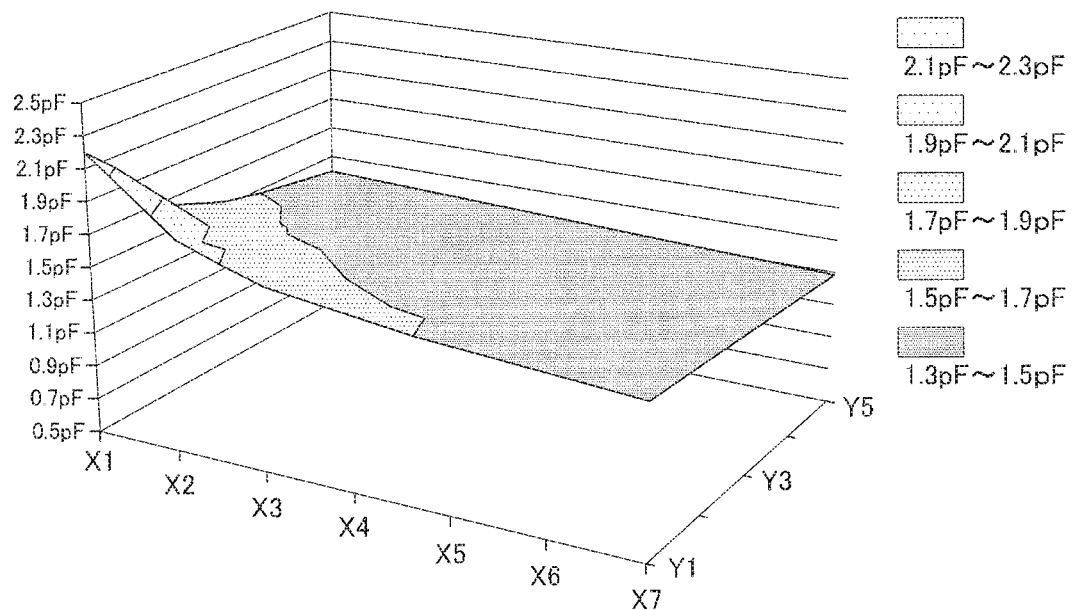
FIG. 12 is an explanatory diagram for explaining one example of the relationship between measured capacitances corresponding to each of coordinate positions on a touchscreen circuit board, and frequency of an AC signal utilized in the measurement.

FIGS. 10 to 12 are explanatory diagrams for explaining one example of the relationship between measured capacitances Cmes corresponding to coordinate positions on the touchscreen circuit board P, and frequency f of AC signal SA utilized in the measurement. FIG. 10 illustrates an example in which the frequency f is a low frequency, FIG. 11 illustrates an example in which the frequency f is a medium frequency higher than that in FIG. 10, and FIG. 12 illustrates an example of the circuit board inspection device 1 illustrated in FIG. 1, in which the frequency f is a high frequency approximately equal to the reading frequency f0.

The capacitances C (m, n) corresponding to the coordinate positions are in principle equal, although there are some variations due to manufacturing variations. When the frequency f is set at a low frequency, the measured capacitances Cmes corresponding to the coordinate positions are approximately equal to each other, as illustrated in FIG. 10, and it will be appreciated that almost the actual capacitances C (m, n) can be measured "as is".

However, when the frequency f is increased, the influence of the internal capacitance Ci and the stray capacitance Cf increases as illustrated in FIG. 11, and differences arise in the measured capacitances Cmes depending on the coordinate positions. What is more, when the frequency f is set to a high frequency that is approximately equal to the reading frequency f0 because of the necessity to improve the reliability in the inspection, the influence of the internal capacitance Ci and the stray capacitance Cf increases significantly, increasing the differences in the measured capacitances Cmes depending on the coordinate positions. Consequently, it becomes difficult to determine whether the touchscreen circuit board P is good or defective based on the measured capacitances Cmes.

Figure 13:
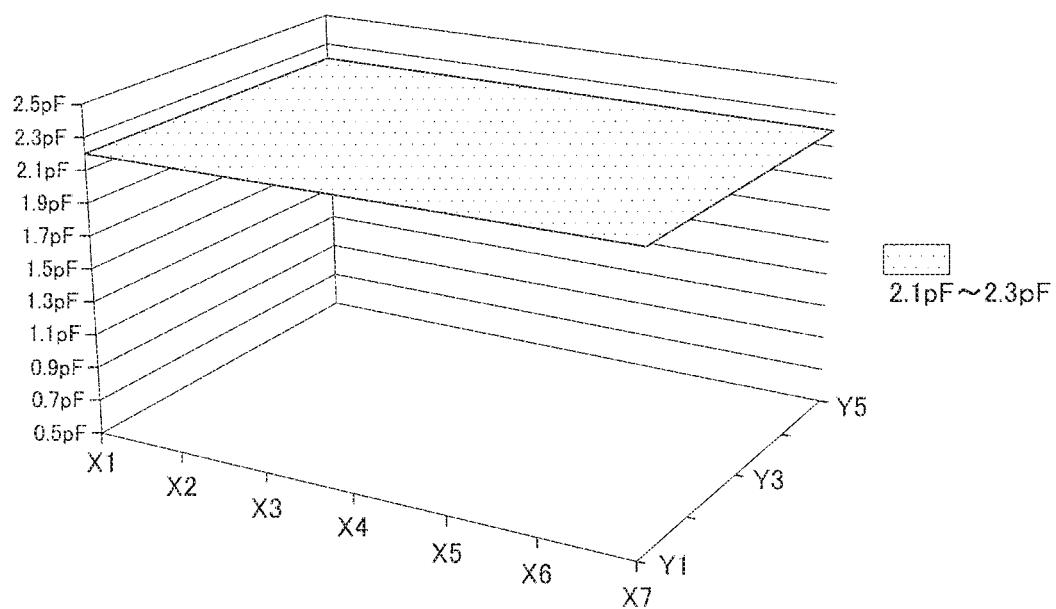
FIG. 13 is an explanatory diagram for illustrating the results of correcting the measured capacitances represented in FIG. 12.

FIG. 13 is an explanatory diagram for illustrating capacitances C obtained as the result of correcting the measured capacitances Cmes represented in FIG. 12 by the process of step S10. As seen in FIG. 13, it was confirmed that the influence of the internal capacitance Ci, the internal resistance value Ri was reduced by the processes of steps S10 and S11, so that the differences in capacitance C depending on the coordinate positions can be reduced.

Figure 14:
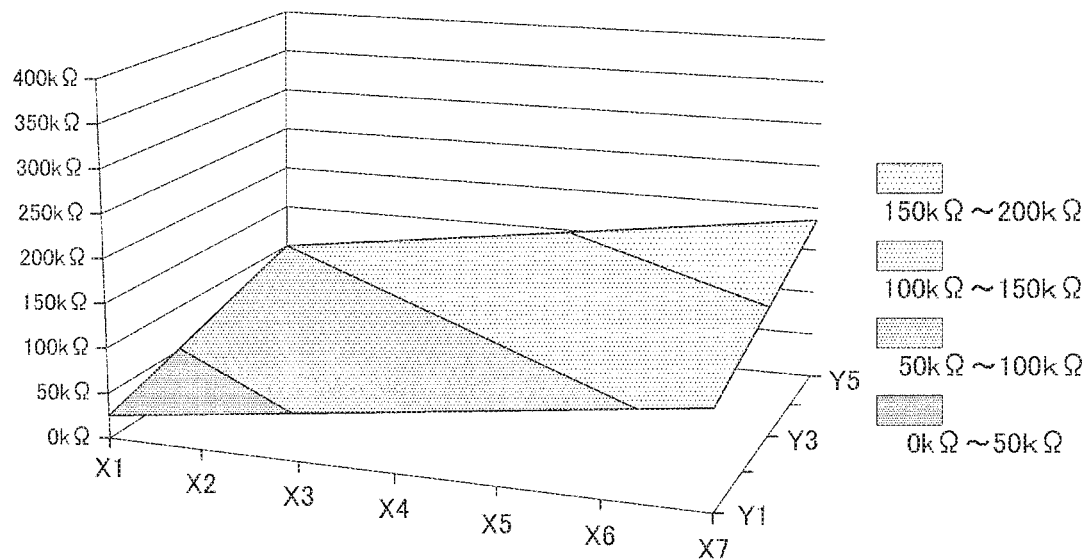
FIG. 14 is a graph representing theoretical values of the resistances corresponding to each of the coordinate positions on the touchscreen circuit board.

FIG. 14 is a graph representing theoretical values of the resistance values R corresponding to the coordinate positions on the touchscreen circuit board P. The resistance values R result in different values depending on coordinate positions because the lengths of the X electrode X and the Y electrode Y on the resistance measurement path are different depending the coordinate positions. However, their values change substantially linearly with respect to the coordinate positions, as illustrated in FIG. 14.

Figure 15:
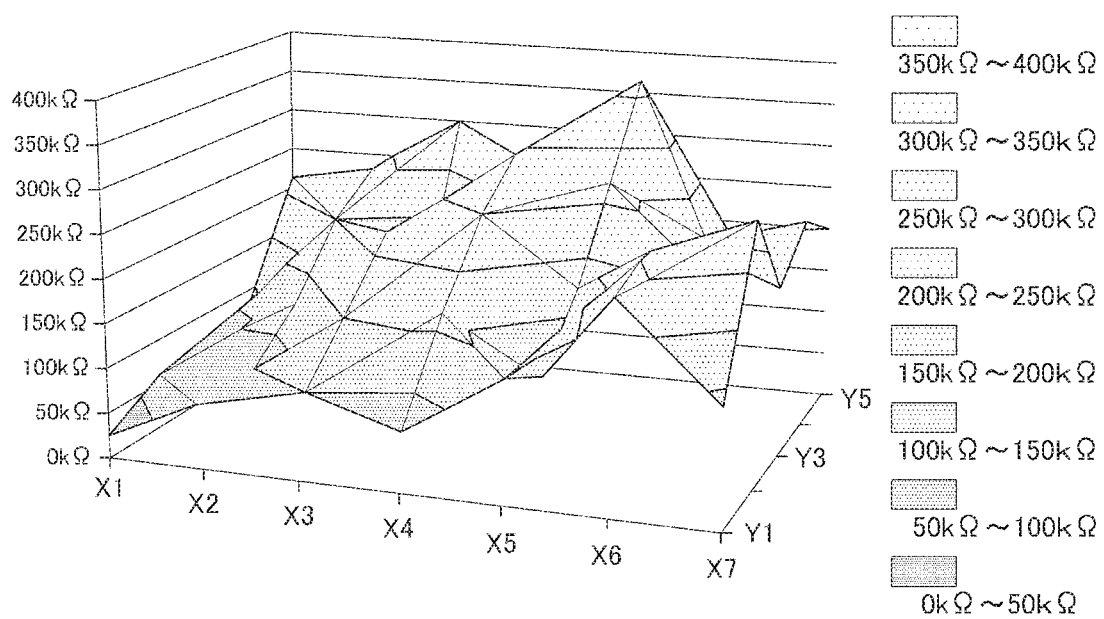
FIG. 15 is a graph representing the relationship between measured resistances corresponding to each of the coordinate positions on the touchscreen circuit board, and measurement frequency.
Figure 16:
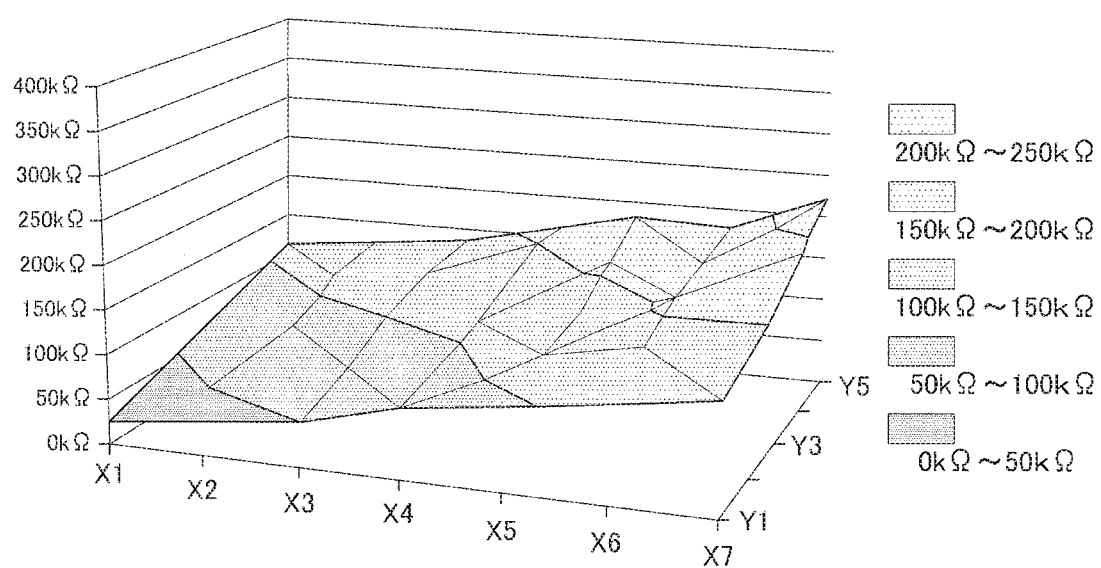
FIG. 16 is a graph representing the relationship between measured resistances corresponding to each of the coordinate positions on the touchscreen circuit board, and measurement frequency.

FIGS. 15 and 16 are graphs representing the relationship between measured resistances Rmes corresponding to each of the coordinate positions on the touchscreen circuit board, and measurement frequency f. In each of FIGS. 15 and 16, the basal plane represents coordinate positions, and the height represents measured resistance values Rmes. FIG. 15 illustrates a case in which the frequency f is a low frequency lower than the reading frequency f0, and FIG. 16 illustrates an example of the circuit board inspection device 1 illustrated in FIG. 1, in which the frequency f is a high frequency approximately equal to the reading frequency f0.

It was confirmed that when the frequency f is a low frequency lower than the reading frequency f0, variations in the measured resistances Rmes for the coordinate positions increase, as illustrated in FIG. 15; in contrast, when the frequency f is a high frequency approximately equal to the reading frequency f0, variations in the measured resistances Rmes are kept to approximately the same as the theoretical values shown in FIG. 14, as illustrated in FIG. 16.

Figure 17:
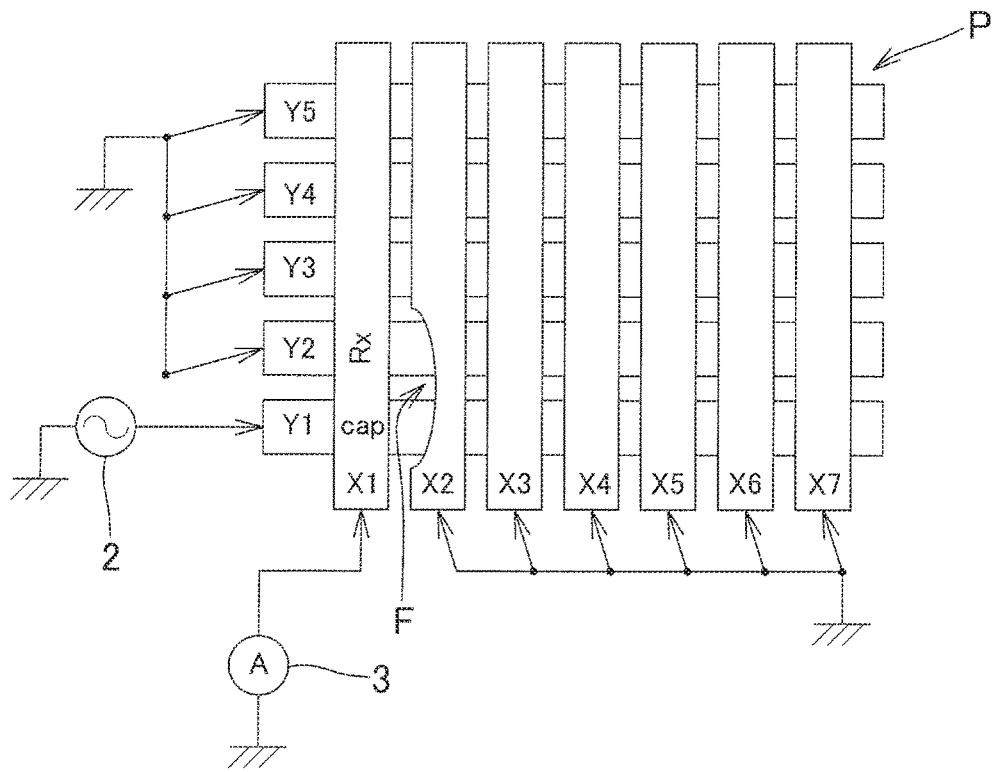
FIG. 17 is an explanatory diagram for explaining a situation in which a defect has occurred in an electrode on a touchscreen circuit board.
Figure 18:
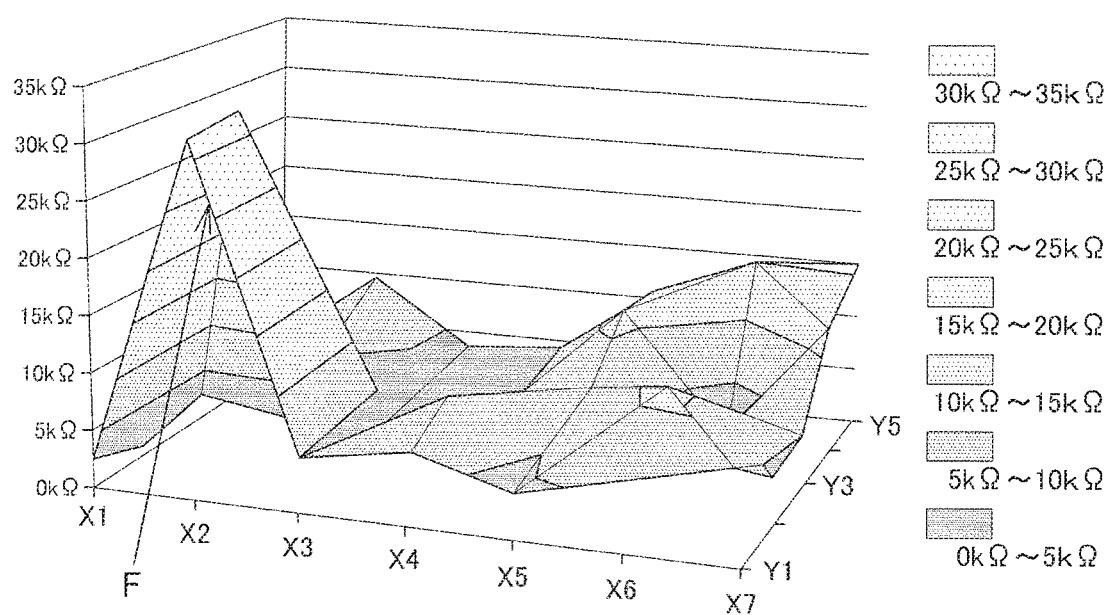
FIG. 18 is a graph representing measured resistances corresponding to each coordinate position with regard the touchscreen circuit board illustrated in FIG. 17.

FIG. 17 is an explanatory diagram for explaining a situation in which a defect F has arisen in the X electrode X2 on the touchscreen circuit board P. In FIG. 17, the defect F is present at a coordinate position (X2, Y1) and a coordinate position (X2, Y2). FIG. 18 is a graph representing differences Dr (m, n) (wherein m=1, 2, 3, 4, 5, 6, or 7; and n=1, 2, 3, 4, or 5) corresponding to the coordinate positions with regard to the touchscreen circuit board P illustrated in FIG. 17. In FIG. 18, the basal plane represents coordinate positions, and the height represents differences Dr.

As seen from FIG. 18, it was confirmed that large peaks of resistance values were observed at the coordinate position (X2, Y1) and the coordinate position (X2, Y2), where the defect F was present, which makes it possible to identify the locations where the defect F has arisen.

Figure 19:
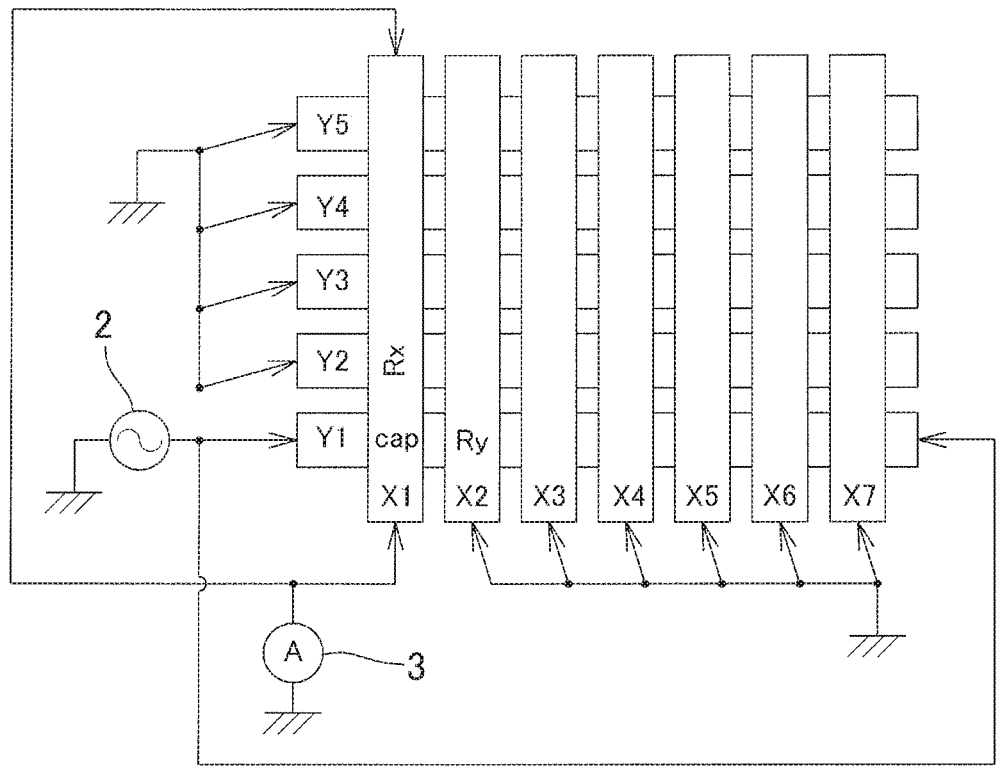
FIG. 19 is an explanatory diagram illustrating a modified example of the circuit board inspection device represented in FIG. 1.
Figure 20:
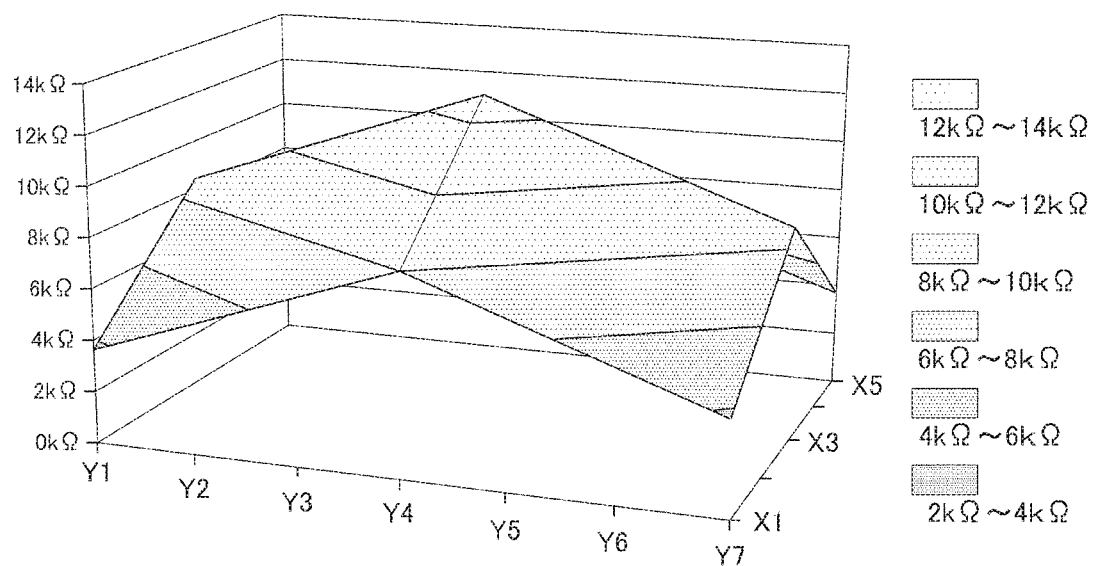
FIG. 20 is a graph of measured resistances corresponding to each coordinate position with regard to a touchscreen circuit board in the circuit board inspection device illustrated in FIG. 19.

FIG. 19 is an explanatory diagram illustrating a modified example of the circuit board inspection device 1 represented in FIG. 1. The circuit board inspection device 1 illustrated in FIG. 1 shows an example in which the ammeter 3 is connected with one end of an X electrode X and the AC power source 2 is connected with one end of a Y electrode Y. However, as illustrated in FIG. 19, it is possible to employ a configuration in which the ammeter 3 is connected with both ends of an X electrode X and the AC power source 2 is connected with both ends of a Y electrode Y. In this case, the graph representing the measured resistances Rmes does not result in a flat shape as shown in FIG. 14, but results in a chevron shape, as illustrated in FIG. 20. In this case as well, the touchscreen circuit board P can be inspected by the processes of steps S1 to S211 illustrated in FIGS. 6 to 9.

It will be appreciated that the calculating unit 42 may cause the display unit 4 to display, for example, a graph as illustrated in FIG. 16 in which resistance values R are shown in place of the measured resistance values Rmes in the graph. Specifically, it is possible that the display unit 5 may display an image representing x coordinates corresponding to the X electrodes X1-X7, y coordinates corresponding to the Y electrodes Y1-Y5, and resistance values R (m, n) at the coordinate positions (Xm, Yn) corresponding to the x-y coordinates in a three-dimensional graph, for example, like the graph shown in FIG. 16.

The calculating unit 42 may cause the display unit 5 to display, for example, the graph illustrated in FIG. 13. Specifically, it is possible that the display unit 5 may display an image representing x coordinates corresponding to the X electrodes X1-X7, y coordinates corresponding to the Y electrodes Y1-Y5, and capacitances C (m, n) at the coordinate positions (Xm, Yn) corresponding to the x-y coordinates, three-dimensionally, for example, like the graph shown in FIG. 13.

It is also possible that, as illustrated in FIG. 18, the display unit 5 may display an image three-dimensionally representing x coordinates corresponding to the X electrodes X1-X7, y coordinates corresponding to the Y electrodes Y1-Y5, and differences Dr (m, n) at the coordinate positions (Xm, Yn) corresponding to the x-y coordinates.

It is also possible to display differences Dc (m, n) in place of the differences Dr (m, n) shown in FIG. 18 That is, the display unit 5 may display an image three-dimensionally representing x coordinates corresponding to the X electrodes X1-X7, y coordinates corresponding to the Y electrodes Y1-Y5, and differences Dc (m, n) at the coordinate positions (Xm, Yn) corresponding to the x-y coordinates.

The invention claimed is:

1. A circuit board inspection device configured to inspect a circuit board including a plurality of first electrodes extending along a predetermined first direction, and a plurality of second electrodes extending along a second direction intersecting the first direction so that the plurality of first electrodes and the plurality of second electrodes oppose each other at intersections of the plurality of first and second electrodes, the circuit board inspection device comprising:
   an AC voltage output unit configured to output a predetermined AC voltage;
   a current detecting unit configured to detect electric current;
   a plurality of first connection terminals electrically connectable respectively with the plurality of first electrodes;
   a plurality of second connection terminals electrically connectable respectively with the plurality of second electrodes;
   a measuring process unit configured to execute a measuring process of, in correspondence with a plurality of combinations obtained by respectively combining the plurality of first connection terminals and the plurality of second connection terminals, and in respect of the first and second connection terminals corresponding to each of the combinations, supplying the AC voltage to the second connection terminals by means of the AC voltage output unit and detecting electric current flowing in the first connection terminals by means of the current detection unit, to thereby acquire currents corresponding to each of the combinations; and
   a calculating unit configured to execute a calculating process of, based on the magnitude of the currents detected by the current detecting unit in the measuring process and on information indicating the currents' phases, calculating capacitance and resistance values corresponding to each of the combinations;
   an internal parameters memory unit storing, as internal capacitance and internal resistance values, capacitance and resistance values arising within the circuit board inspection device interior in correspondence with each of the combinations; wherein
   the calculating unit further executes an internal parameters correction process of correcting the capacitance and resistance values corresponding to each of the combinations, based on the internal capacitance and internal resistance values stored in the internal parameters memory unit in correspondence with each of the combinations.

2. The circuit board inspection device set forth in claim 1, further comprising:
   an internal parameters acquisition process unit configured to store capacitance and resistance values, obtained in correspondence with each of the combinations by executing the measuring process and the calculating process by means of the measuring process unit and the calculating unit in a state in which the pluralities of first and second electrodes are not connected with the plurality of first and second connection terminals, in the internal parameters memory unit as the internal capacitance and internal resistance values corresponding to each of the combinations.

3. The circuit board inspection device set forth in claim 2, further comprising:
   a stray capacitance memory unit storing stray capacitances, produced in the circuit board, corresponding to each of the combinations; wherein
   the calculating unit executes a stray capacitance correction process of correcting the capacitances corresponding to each of the combinations, based on the stray capacitances stored in the stray capacitance memory unit in correspondence with each of the combinations.

4. The circuit board inspection device set forth in claim 2, further comprising:
   a judgment values memory unit storing in advance judgment values constituting references for judging quality of the resistance values corresponding to each of the combinations; and
   a judgment unit configured to calculate differences, respectively in correspondence with each of the combinations, between the resistance values corresponding to each of the combinations, obtained by means of the calculating unit, and the judgment values stored in the judgment values memory unit in correspondence with each of the combinations, and if the differences corresponding to each of the combinations exceed preestablished difference judgment values, judging coordinate positions represented by the first and second electrodes corresponding to the combinations in which the difference judgment values are exceeded to be defective positions on the circuit board.

5. The circuit board inspection device set forth in claim 1, further comprising:
   a stray capacitance memory unit storing stray capacitances, produced in the circuit board, corresponding to each of the combinations; wherein
   the calculating unit executes a stray capacitance correction process of correcting the capacitances corresponding to each of the combinations, based on the stray capacitances stored in the stray capacitance memory unit in correspondence with each of the combinations.

6. The circuit board inspection device set forth in claim 5, further comprising:
   a reference capacitance memory unit storing reference capacitances corresponding to each of the combinations, for a reference circuit board for which the reference capacitances, being capacitances produced circuit board-internally corresponding to each of the combinations, have been found in advance; and
   a stray capacitance acquisition process unit configured to calculate and store in the stray capacitance memory unit, stray capacitances corresponding to each of the combinations, in a state in which with respect to the reference circuit board, the pluralities of first and second connection terminals are connected, based on capacitances obtained corresponding to each of the combinations by executing the measuring process and the calculating process by the measuring process unit and the calculating unit, and based on the reference capacitances stored corresponding to each of the combinations by means of the reference capacitance memory unit.

7. The circuit board inspection device set forth in claim 5, further comprising:
   a judgment values memory unit storing in advance judgment values constituting references for judging quality of the resistance values corresponding to each of the combinations; and
   a judgment unit configured to calculate differences, respectively in correspondence with each of the combinations, between the resistance values corresponding to each of the combinations, obtained by means of the calculating unit, and the judgment values stored in the judgment values memory unit in correspondence with each of the combinations, and if the differences corresponding to each of the combinations exceed preestablished difference judgment values, judging coordinate positions represented by the first and second electrodes corresponding to the combinations in which the difference judgment values are exceeded to be defective positions on the circuit board.

8. The circuit board inspection device set forth in claim 1, further comprising:
  a judgment values memory unit storing in advance judgment values constituting references for judging quality of the resistance values corresponding to each of the combinations; and
  a judgment unit configured to calculate differences, respectively in correspondence with each of the combinations, between the resistance values corresponding to each of the combinations, obtained by means of the calculating unit, and the judgment values stored in the judgment values memory unit in correspondence with each of the combinations, and if the differences corresponding to each of the combinations exceed predetermined difference judgment values, judging coordinate positions represented by the first and second electrodes corresponding to the combinations in which the difference judgment values are exceeded to be defective positions on the circuit board.

9. The circuit board inspection device set forth claim 8, further comprising a display unit configured to display an image in which the differences, calculated by means of the judgment unit, corresponding to each of the combinations are represented by a three-dimensional graph.

10. The circuit board inspection device set forth in claim 1, further comprising a display unit configured to display an image in which the resistance values, calculated by means of the calculating process, corresponding to each of the combinations are represented by a three-dimensional graph.

11. The circuit board inspection device set forth in claim 1, further comprising a display unit configured to display an image in which the capacitance values, calculated by means of the calculating process, corresponding to each of the combinations are represented by a three-dimensional graph.

12. A circuit board inspection method for inspecting a circuit board in which a plurality of first electrodes extending along a predetermined first direction, and a plurality of second electrodes extending along a second direction intersecting the first direction so that the plurality of first electrodes and the plurality of second electrodes oppose each other at intersections of the plurality of first and second electrodes, the circuit board inspection method comprising:
  electrically connecting a plurality of first connection terminals respectively with the plurality of first electrodes;
  electrically connecting a plurality of second connection terminals respectively with the plurality of second electrodes;
  executing a measuring process of, in correspondence with a plurality of combinations obtained by respectively combining the plurality of first connection terminals and the plurality of second connection terminals, and in respect of the first and second connection terminals corresponding to each of the combinations, supplying an AC voltage to the second connection terminals and detecting electric current flowing in the first connection terminals, to thereby acquire currents corresponding to each of the combinations;
  executing a calculating process of, based on the magnitude of the currents detected in the measuring process and on information indicating the currents' phases, calculating capacitance and resistance values corresponding to each of the combinations;
  storing, as internal capacitance and internal resistance values, capacitance and resistance values arising in correspondence with each of the combinations; and
  further executing an internal parameters correction process of correcting the capacitance and resistance values corresponding to each of the combinations, based on the internal capacitance and internal resistance values stored in correspondence with each of the combinations.

* * * * *